United States Patent
Barik et al.

(10) Patent No.: US 12,293,900 B2
(45) Date of Patent: May 6, 2025

(54) APPARATUS AND METHOD FOR FILM FORMATION

(71) Applicant: Gallium Enterprises Pty Ltd, Silverwater (AU)

(72) Inventors: Satyanarayan Barik, Holroyd (AU); Marie-Pierre Francoise Wintrebert Ep Fouquet, Silverwater (AU); Ian Mann, Silverwater (AU)

(73) Assignee: GALLIUM ENTERPRISES PTY LTD, New South Wales (AU)

( * ) Notice: Subject to any disclaimer, the term of this patent is extended or adjusted under 35 U.S.C. 154(b) by 431 days.

(21) Appl. No.: 17/171,468

(22) Filed: Feb. 9, 2021

(65) Prior Publication Data
US 2021/0166913 A1    Jun. 3, 2021

Related U.S. Application Data

(62) Division of application No. 14/413,587, filed as application No. PCT/AU2013/000786 on Jul. 15, 2013, now abandoned.

(30) Foreign Application Priority Data

Jul. 13, 2012 (AU) ................ 2012903023
Aug. 10, 2012 (AU) ................ 2012903455

(51) Int. Cl.
C23C 16/00 (2006.01)
C01B 21/06 (2006.01)
(Continued)

(52) U.S. Cl.
CPC ...... *H01J 37/3244* (2013.01); *C01B 21/0632* (2013.01); *C23C 16/303* (2013.01);
(Continued)

(58) Field of Classification Search
None
See application file for complete search history.

(56) References Cited

U.S. PATENT DOCUMENTS 4,638,762 A     1/1987  Kim et al.
5,366,555 A *  11/1994  Kelly ............... C23C 16/45536
                                                        118/723 MR
(Continued)

FOREIGN PATENT DOCUMENTS

JP       10106958 A      4/1998
WO    2010054184 A2      5/2010
(Continued)

OTHER PUBLICATIONS

International Search Report dated Sep. 23, 2013 for Intl. App. No. PCT/AU2013/000786, 3 pgs.

*Primary Examiner* — David P Turocy
(74) *Attorney, Agent, or Firm* — Fredrikson & Byron, P.A.

(57) ABSTRACT

An apparatus and method for forming a thin film on a substrate by RPCVD which provides for very low levels of carbon and oxygen impurities and includes the steps of introducing a Group VA plasma into a first deposition zone of a growth chamber, introducing a Group IIIA reagent into a second deposition zone of the growth chamber which is separate from the first deposition zone and introducing an amount of an additional reagent selected from the group consisting of ammonia, hydrazine, di-methyl hydrazine and a hydrogen plasma through an additional reagent inlet into the second deposition zone such that the additional reagent and the Group IIIA reagent mix prior to deposition.

15 Claims, 14 Drawing Sheets

(51) Int. Cl.

| | |
|---|---|
| *C23C 16/30* | (2006.01) |
| *C23C 16/452* | (2006.01) |
| *C23C 16/455* | (2006.01) |
| *C23C 16/513* | (2006.01) |
| *H01B 1/06* | (2006.01) |
| *H01J 37/32* | (2006.01) |
| *H01L 21/02* | (2006.01) |
| *H01L 29/20* | (2006.01) |

(52) U.S. Cl.
 CPC .......... *C23C 16/452* (2013.01); *C23C 16/455* (2013.01); *C23C 16/45536* (2013.01); *C23C 16/45551* (2013.01); *C23C 16/513* (2013.01); *H01B 1/06* (2013.01); *H01J 37/32357* (2013.01); *H01L 21/0254* (2013.01); *H01L 21/0257* (2013.01); *H01L 21/0262* (2013.01); *H01L 29/2003* (2013.01)

(56) References Cited

U.S. PATENT DOCUMENTS

| | | | |
|---|---|---|---|
| 5,730,802 | A | 3/1998 | Ishizumi et al. |
| 7,435,445 | B2 | 10/2008 | Shin et al. |
| 8,129,288 | B2 | 3/2012 | Shanker et al. |
| 8,143,147 | B1 | 3/2012 | Kraus et al. |
| 8,187,679 | B2 | 5/2012 | Dickey et al. |
| 2003/0098372 | A1 | 5/2003 | Kim |
| 2007/0071896 | A1 | 3/2007 | Murphy et al. |
| 2008/0152903 | A1 | 6/2008 | Von Kaenel |
| 2008/0193643 | A1 | 8/2008 | Dip |
| 2010/0087050 | A1 | 4/2010 | Armour et al. |
| 2010/0162945 | A1 | 7/2010 | Shibata et al. |
| 2011/0033966 | A1 | 2/2011 | Su et al. |
| 2011/0236598 | A1 | 9/2011 | Kumagai et al. |
| 2011/0244617 | A1* | 10/2011 | Su .................... C23C 16/54 438/46 |
| 2012/0021252 | A1 | 1/2012 | Lee |
| 2012/0070963 | A1* | 3/2012 | Martin .............. H01J 37/32633 118/723 R |
| 2013/0171805 | A1* | 7/2013 | Kraus .................... C30B 25/14 257/E21.09 |
| 2014/0014965 | A1* | 1/2014 | Kraus ................ H01L 21/0262 257/798 |

FOREIGN PATENT DOCUMENTS

| | | |
|---|---|---|
| WO | 2010091470 A1 | 8/2010 |
| WO | 2011041255 A1 | 4/2011 |

\* cited by examiner

APPARATUS AND METHOD FOR FILM FORMATION

RELATED APPLICATIONS

This application is a division of application Ser. No. 14/413,587, filed Jan. 8, 2015, which is a 35 U.S.C. 371 national stage filing from International Application No. PCT/AU2013/000786, filed Jul. 15, 2013, which claims priority to Australian Application No. 2012903455, filed Aug. 10, 2012, and to Australian Application No. 2012903023, filed Jul. 13, 2012, the teachings of which are incorporated herein by reference.

FIELD OF THE INVENTION

The present invention relates to an apparatus and method for the production of films by chemical vapour deposition.

BACKGROUND OF THE INVENTION

Metal or metalloid containing films, such as gallium nitride (GaN) films, have applications in a range of devices from light emitting diodes (LEDs) to ultraviolet detectors to transistor devices.

These films have commonly been produced by techniques including molecular beam epitaxy (MBE), metal organic chemical vapour deposition (MOCVD) and remote plasma enhanced chemical vapour deposition (RPECVD or RPCVD). RPECVD has been employed to produce films of high quality at considerably lower temperatures than those used in MOCVD which thereby reduces process costs and allows the use of temperature sensitive preferred substrates for film deposition.

One problem which must be addressed during film production using any chemical vapour deposition (CVD) technique is to obtain an even and controlled distribution of reagents across the substrate of the surface onto which the film is to be grown to thereby achieve uniform thin film growth. At least part of the solution to this problem may be addressed by the design of the distribution systems. For example, in RPECVD a shower head or lattice design may be employed to obtain an even distribution of metal organic reagent across the substrate while a baffle may be used to enhance the even distribution of the plasma stream of active nitrogen species. One such baffle design is disclosed in WO/2010/091470, the disclosure of which is hereby incorporated in its entirety, wherein an 'inverse pagoda' style of baffle is used to diffuse and filter the plasma stream.

Many of these approaches focus on growth of a single film and so the reagent, e.g. metal organic, distribution lattice and plasma channel with baffle are generally centred over the substrate location to thereby provide a generally homogeneous distribution of both materials over the entire substrate surface. This form of chamber design is not so effective when it is desired to grow a plurality of films within the same growth chamber to improve productivity.

The use of multiple substrates is particularly desirable in those film deposition techniques where the growth rate is extremely slow. For example, atomic layer deposition (ALD) is a useful growth technique based upon the sequential pulsing of chemical precursor vapours to thereby achieve one atomic layer per pulse. Due to the sequential pulsing arrangement of ALD each reagent pulse reacts with the deposition surface until the reaction is completed. A purge gas is used to carry away excess reagent and reaction side products after each pulse in an attempt to minimize impurities being deposited in the film.

ALD is of interest due to the ability to produce thin uniform films with a high degree of control over film thickness and composition. One of the drawbacks of ALD is the amount of time required to grow a useful film since only a monolayer may be deposited in each complete deposition cycle. The time required for each cycle is limited by the switching speed of the reagent release valves as well as the time taken to purge after each half cycle and rotate the substrate into place. This results in each full cycle taking from 0.5 to a few seconds, further contributing to the slow production.

Further, the purging cycle is not entirely effective which often means that an amount of the metal organic reagent, such as trimethylgallium (TMG), remains in the growth chamber during pulsing of the plasma containing the active second reagent, such as nitrogen. This may result in carbon impurities being incorporated into the growing film, thereby reducing its quality.

Minimizing the extent of incorporation of both carbon and oxygen, as impurities, in the growing film is a major challenge in CVD film production. As well as altering the desired chemical composition of the film these impurities disrupt the lattice matching of forming layers thereby causing defects within the film and negatively impacting on the overall quality of the product.

MOCVD approaches have been relatively more successful than certain other CVD techniques at lowering oxygen incorporation into the growing thin films but levels of carbon incorporation are not ideal. More particularly, MOCVD often involves growth temperatures of about 1000° C. to 1200° C., which thereby results in high equipment costs and rules out the use of temperature sensitive preferred substrates for film deposition.

It would thus be desirable to provide for a CVD apparatus and method which could provide for the advantages in control of film growth afforded by ALD while minimizing the drawbacks of that technique. Particularly, it would be useful to provide for a CVD apparatus and method allowing for a reduction in the levels of incorporation of carbon and oxygen as impurities in the film product and preferably a CVD apparatus and method which can be run at lower temperatures than those employed in a standard MOCVD approach.

SUMMARY OF THE INVENTION

In a first aspect, although it need not be the only or indeed the broadest form, the invention resides in an RPCVD apparatus for forming a film, the apparatus including a growth chamber comprising:
  (a) a Group VA plasma inlet located in a first deposition zone of the growth chamber to introduce a Group VA plasma thereto;
  (b) a Group IIIA reagent inlet located in a second deposition zone of the growth chamber to introduce a Group IIIA reagent thereto;
  (c) an additional reagent inlet adjacent the Group IIIA reagent inlet to introduce an additional reagent selected from the group consisting of ammonia, hydrazine, di-methyl hydrazine and a hydrogen plasma into the second deposition zone such that the additional reagent and Group IIIA reagent mix prior to deposition; and
  (d) a substrate holder adapted to support one or more substrates and rotate each substrate between the first and second deposition zones.

Preferably, the additional reagent inlet is an ammonia inlet.

Preferably, the Group VA plasma inlet, the Group IIIA reagent inlet and the additional reagent inlet open into the growth chamber at a distance between about 1 cm to about 30 cm from a growth surface of the one or more substrates. More preferably, between about 1 to about 20 cm or 1 to about 10 cm.

Preferably, a ceiling of the growth chamber is located less than about 30 cm vertically above the location of the substrates, more preferably less than about 25 cm, even more preferably less than about 20 cm, still more preferably less than about 10 cm. Values of 5 cm and 7.5 cm may be useful with 3 cm to 4 cm as the lower end values.

In certain embodiments at least one of the Group VA plasma inlet, the Group IIIA reagent inlet and the additional reagent inlet end flush with the ceiling of the growth chamber which is located between about 1 to about 30 cm, 1 to 20 cm, 1 to 10 cm vertically above a growth surface of the substrates, preferably, between 4 to 15 cm, 4 to 10 cm, 4 to 8 cm.

Suitably, an opening of the additional reagent inlet opens into the growth chamber in close proximity to the one or more substrates.

The additional reagent inlet may extend downwardly from the ceiling of the growth chamber to end in close proximity to the growth surface of the one or more substrates.

In one embodiment, the additional reagent inlet opens into the growth chamber through a side wall thereof at a height suitable to enable a flow of additional reagent entering therethrough to have a flow path passing over and substantially adjacent to the growth surface of the one or more substrates.

In a preferred embodiment there is a direct flow path between the Group VA plasma inlet and the one or more substrates.

Suitably, the direct flow path between the Group VA plasma inlet and the one or more substrates extends to an unimpeded path between a plasma generator for generating the Group VA plasma and the one or more substrates.

In an embodiment, the Group VA plasma inlet and the Group IIIA reagent inlet end flush with a ceiling and/or side wall of the growth chamber through which they extend.

Preferably, the first deposition zone is substantially isolated from the second deposition zone.

Preferably, rotation of the substrate holder causes the one or more substrates to pass sequentially from the first deposition zone to the second deposition zone.

Preferably, the substrate holder is of a turntable design whereby it rotates around a central pivot and is provided with a plurality of recesses, each adapted to hold a substrate, around its periphery.

The Group VA plasma inlet and the Group IIIA reagent inlet may be located centrally within the growth chamber.

When the Group VA plasma inlet and the Group IIIA reagent inlet are located centrally within the growth chamber one or both thereof may be provided with a flow control device to direct the corresponding plasma or reagent into the appropriate first or second deposition zone.

The flow control device may be a flow barrier blocking one or more reagent flow paths within the Group VA plasma inlet or the Group IIIA reagent inlet or a directing portion, such as a shroud, continuous with the first or second reagent inlet.

In one embodiment, the apparatus may further comprise a baffle associated with the Group VA plasma inlet such that the plasma substantially passes therethrough.

The baffle may comprise the flow control device which may be a flow barrier blocking one or more outlets of the baffle.

Preferably, the additional reagent inlet opens into the growth chamber substantially adjacent to the opening of the Group IIIA reagent inlet to promote mixing of said reagents prior to their contacting the one or more substrates.

Suitably, the Group VA plasma inlet is in fluid communication with a plasma generator producing a Group VA plasma comprising an active species.

Preferably, the Group VA plasma is a nitrogen plasma comprising active nitrogen species.

Suitably, the Group IIIA reagent is a Group IIIA metal organic reagent.

In one particularly preferred embodiment, the Group VA plasma inlet and the Group IIIA reagent inlet are located peripherally within the growth chamber.

Suitably, the Group VA plasma inlet and the Group IIIA reagent inlet are located substantially at opposite ends of the growth chamber.

The growth chamber may comprise one or more structures associated with the additional reagent inlet and/or the Group IIIA reagent inlet to promote mixing of said reagents immediately prior to their contacting the one or more substrates.

The apparatus may further comprise one or more heating devices to heat the additional reagent inlet and/or the Group IIIA reagent inlet prior to entering the growth chamber.

In a second aspect the invention resides in a method of forming a thin film on a substrate by RPCVD including the steps of:
(a) introducing a Group VA plasma through a Group VA plasma inlet into a first deposition zone of a growth chamber;
(b) introducing a Group IIIA reagent through a Group IIIA reagent inlet into a second deposition zone of the growth chamber, the second deposition zone being substantially isolated from the first deposition zone;
(c) introducing an additional reagent selected from the group consisting of ammonia, hydrazine, di-methyl hydrazine and hydrogen plasma through an additional reagent inlet into the second deposition zone such that the additional reagent and the Group IIIA reagent mix prior to deposition;
(d) moving the substrate between the first and second deposition zones,
to thereby form a thin film on the substrate.

Preferably, the additional reagent is ammonia.

Suitably, the additional reagent is introduced into the second deposition zone substantially adjacent the opening of the Group IIIA inlet.

In one embodiment, the additional reagent is introduced into the growth chamber through a side wall thereof.

In one embodiment, the additional reagent is introduced into the growth chamber to form a substantially horizontal flow path passing over and substantially adjacent to the growth surface of the substrate.

The additional reagent and the Group IIIA reagent are preferably being introduced into the growth chamber simultaneously.

Suitably, the Group IIIA reagent is a Group IIIA metal organic reagent.

Preferably, the Group IIIA metal organic reagent is a Group IIIA metal alkyl reagent.

Preferably, the Group IIIA metal alkyl reagent is selected from the group consisting of trimethylgallium, triethylgallium, trimethylindium and trimethylaluminium.

The method may further include the step of heating one or more of the reagents prior to their entering the growth chamber.

The method may further include the step of promoting the mixing of the metal organic reagent and the additional reagent adjacent the one or more substrates.

Suitably, the Group VA plasma inlet is in fluid communication with a plasma generator.

Preferably, the Group VA plasma is a nitrogen plasma comprising active nitrogen species.

The isolation of the deposition zones substantially prevents the mixing of the Group VA plasma and Group IIIA reagent.

The method may further include the step of controlling the flow of one or more of the Group VA plasma or Group IIIA reagent upon exiting the associated inlet to direct that flow to a desired deposition zone.

The method may further include the step of controlling the temperature to be between about 400 to about 1200° C., preferably between about 500 to about 1000° C. (inclusive of a temperature of about 500° C., 600° C., 700° C., 800° C., 900° C. or 1000° C.), more preferably between about 500 to about 850° C.

In combination with the presence of an additional reagent gas, preferably ammonia, it has been found that the power of the plasma generator has an effect on carbon incorporation into the thin film and so the method may also include the step of controlling the power of the plasma generator to be between about 500 W to about 5000 W from a single source. This may be combined with a growth pressure of 2-5 torr and a nitrogen plasma flow of 2000-3000 sccm with an ammonia flow of about 15 to about 1500 sccm, preferably about 20 to about 200 sccm, preferably about 20 to about 100 sccm, more preferably about 20 to about 50 sccm.

The growth pressure may be between 2-5 torr, 2-4 torr or about 3 torr.

Preferably, the power of the plasma generator is between about 100 watts to about 3000 watts with a nitrogen flow rate of 1000-3000 sccm extending to 100-20000 sccm in a commercial unit. A preferred metal organic reagent flow rate is 1200-2000 sccm which may extend to 100-10000 sccm in a commercial unit. A value for the plasma generator power of about 500 to 5000 W, 500 to 4000, 500 to 3000, 500 to 2000, 500 to 1000, 500 to 900 W, 500 to 800 W, 600 to 1000 W, 600 to 900 W, 600 to 800 W, 700 to 1000 W, 700 to 900 W and preferably about 800 W is preferred and each value or range of which may be independently coupled with an ammonia flow rate of any one of between 15 to 1500 sccm. For relatively small growth chambers it is found that ammonia flows of 10 to 75, 10 to 60, 10 to 50 10 to 40, 10 to 30, 15 to 75, 15 to 60 15 to 50, 15 to 40, 15 to 35, 15 to 30, 20 to 75, 20 to 60, 20 to 50, 20 to 40, 20 to 30, including values of about 15, 20, 25, 30, 35, 40, 45 and 50 sccm are particularly useful in lowering carbon incorporation, however, in moving to commercial scales higher powers and multiple plasma sites are envisaged as being useful.

In a third aspect the invention resides in a method of forming a thin film having a carbon impurity content of less than about 5E+17 atom/cm$^3$, on a substrate by RPCVD including the steps of:

(a) introducing a Group VA plasma through a Group VA plasma inlet into a first deposition zone of a growth chamber wherein a direct flow path is provided between the Group VA plasma inlet and a substrate located in the first deposition zone;

(b) introducing a Group IIIA reagent through a Group IIIA reagent inlet into a second deposition zone of the growth chamber, the second deposition zone being substantially isolated from the first deposition zone;

(c) introducing an additional reagent selected from the group consisting of ammonia, hydrazine, di-methyl hydrazine and hydrogen plasma through an additional reagent inlet into the second deposition zone such that the additional reagent and the Group IIIA reagent mix prior to deposition;

(d) moving the substrate between the first and second deposition zones, to thereby form a thin film on the substrate having a carbon impurity content of less than about 5E+17 atom/cm$^3$.

Preferably, the carbon impurity content is less than about 3E+17 atom/cm$^3$, even more preferably less than about 2E+17 atom/cm$^3$, yet more preferably less than or about 1E+17 atom/cm$^3$. A lower limit may be considered to be about the SIMS detection limit for carbon impurities in such films.

In one embodiment, the thin film also has an oxygen impurity content of less than about 8E+17 atom/cm$^3$, even more preferably less than about 6E+17 atom/cm$^3$, yet more preferably less than about 4E+17 atom/cm$^3$, still more preferably less than about 2E+17 atom/cm$^3$, or even less than or about 1E+17 atom/cm$^3$. A lower limit may be considered to be about the SIMS detection limit for oxygen impurities in such films.

The statements made above in relation to the second aspect apply equally well to the third aspect.

In a fourth aspect the invention resides in a film made by the method of the second or third aspects.

In a fifth aspect the invention resides in use of a film of the fourth aspect in a semiconductor device.

Further features of the present invention will become apparent from the following detailed description.

Throughout this specification, unless the context requires otherwise, the words "comprise", "comprises" and "comprising" will be understood to imply the inclusion of a stated integer or group of integers but not the exclusion of any other integer or group of integers.

BRIEF DESCRIPTION OF THE FIGURES

In order that the invention may be readily understood and put into practical effect, preferred embodiments will now be described by way of example with reference to the accompanying figures wherein.

DETAILED DESCRIPTION OF THE INVENTION

Figure 1:
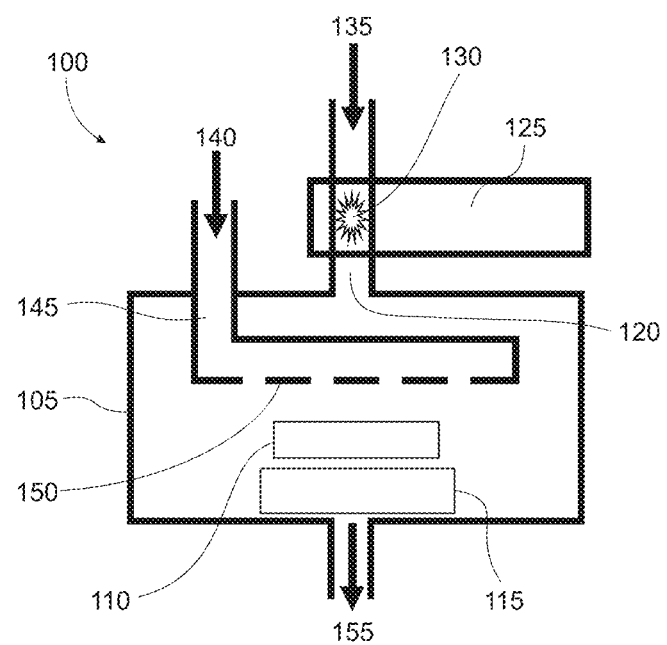
FIG. 1 shows a schematic representation of a typical RPCVD apparatus for depositing a metal nitride film on a substrate.

The present inventors have identified a particular RPCVD apparatus and process conditions for the production of high quality films which results in improvements to the film growth rate and growth control, by comparison to standard ALD techniques and other CVD processes, and, importantly, which provides for a surprising level of reduction in oxygen and carbon-based film impurities due to reagent side reactions.

The reagents which may be employed with the present apparatus and method, and hence the nature of the films which can be formed, are not particularly limited. Although the embodiments discussed herein generally employ a nitrogen plasma and a metal organic (typically a gallium containing metal organic such as trimethylgallium) as the reagents, the utility of the present invention is not so limited. The Group IIIA (otherwise known as Group 13 under the current IUPAC system) reagent may comprise an element which is selected from the group consisting of boron (B), aluminium (Al), gallium (Ga), indium (In) or thallium (Tl). The Group VA (otherwise known as Group 15 under the current IUPAC system) plasma may be generated from any suitable reagent containing a Group VA element selected from the group consisting of nitrogen (N), phosphorus (P), arsenic (As), antimony (Sb) and bismuth (Bi).

The term "deposition zone" as used herein is used to refer to a distinct region, section or segment of the growth chamber into which one or more reagents are introduced. Individual depositions zones, such as first and second deposition zones, are isolated one from the other such that a substrate or growing film will only be substantially exposed to a particular reagent introduced only into one deposition zone when the substrate or growing film actually enters that deposition zone. The separation or isolation of deposition zones may be spatial only or may be effected by partial or complete physical barriers.

In the embodiments described the reagents employed will be trimethylgallium, a nitrogen plasma and ammonia but the person skilled in the art will appreciate the principles disclosed herein could be applied mutatis mutandis to other reagent combinations.

Without wishing to be bound by any particular theory, the present inventors have postulated that an experimentally observed dramatic reduction in the levels of oxygen and carbon incorporated into gallium nitride films produced in an RPCVD apparatus are due to a choice of conditions, including, primarily, the supply of an additional gaseous reagent, preferably ammonia gas, to mix with the Group IIIA reagent and preferably in close proximity to the substrate, which favours formation of a trimethylgallium:ammonia Lewis acid:base adduct. This adduct breaks down to form gallium nitride with the release of methane gas which is not incorporated into the growing film to the same extent as methyl radicals would be.

In typical prior art CVD approaches, and particularly MOCVD due to the high temperatures employed, a molecule of trimethylgallium injected into the growth chamber will decompose thermally to finally produce a gallium atom and three methyl radicals. The gallium will react with the nitrogen source, which may be ammonia or a nitrogen plasma, to form the GaN film. The reactive methyl radicals are often incorporated into the growing film as an impurity thereby increasing strain and lowering the overall quality of the film product. Additional hydrogen-containing reagents, such as ammonia gas, are typically only introduced with the plasma stream and the benefits produced herein are not seen with such an approach.

When the growth temperature is instead kept below the thermal decomposition point of trimethylgallium and an additional reagent, preferably ammonia, is introduced into the growth chamber then the two components form a Lewis acid-base adduct of proposed formula $(CH_3)_3Ga:NH_3$. It is further proposed that this adduct reacts to form an intermediate $(CH_3)_2Ga:NH_2+CH_4$. A further step in this pathway leads to the formation of an adduct of formula $[(CH_3)_2Ga:NH_2]_3$ with eventual formation, from that structure, of three molecules of GaN and six molecules of $CH_4$ gas. The methane gas is less reactive than a methyl radical and is easily removed via the exhaust of the growth chamber.

The inventors have further postulated that such adduct formation and preference of the formation of methane over methyl radicals can be encouraged by minimizing the extent of the reactions which occur in the gas phase i.e. in the upper and central regions of the growth chamber and instead maximizing the mixing of the reagents only in the immediate vicinity of the substrates. This can be achieved by introducing the ammonia or other additional reagent into the growth chamber with the Group IIA reagent in a manner which causes it to be present or available only adjacent the substrates and hence the growth surface of the growing film.

FIG. 1 shows a schematic representation of a typical RPCVD apparatus 100 for depositing a Group IIIA nitride film on a substrate. The apparatus 100 comprises a growth chamber 105 inside which film growth will occur. Located within the growth chamber 105 is a substrate 110 which is supported by a substrate holder 115 which may include or be connected to a heater to allow the substrate 110 to be adjusted to growth temperatures. A plasma inlet 120, located at a distance from the substrate 110, allows for entry of plasma 130 formed in the high frequency generator 125 into the growth chamber 105. The high frequency generator 125 acts on a region of the apparatus 100 receiving nitrogen from a nitrogen source 135. A Group IIIA reagent source which is usually a Group IIIA metal organic reagent source 140, which is usually also at a distance from the substrate 110 i.e. not adjacent thereto, introduces the metal organic into a flow path 145 which delivers the reagent to a metal organic injector 150 for dispersion into the growth chamber 105.

It can be seen that the plasma enters an area of the growth chamber 105 directly above the metal organic injector 150 and so, in operation, the plasma containing active neutral nitrogen species and the metal organic reagent mix and react to form the particular metal nitride, such as gallium nitride, which is deposited on the substrate to form the film. Excess reagents, carrier gases, contaminants etc are removed via a waste outlet 155.

Carbon and oxygen are inevitably incorporated as impurities into the film but, these aside, this approach is generally satisfactory for the formation of a film on a single substrate. However, it is often desirable to have the capacity to generate a number of such films at the same time. Hence, an apparatus such as that shown in FIG. 2 may be useful.

Figure 2:
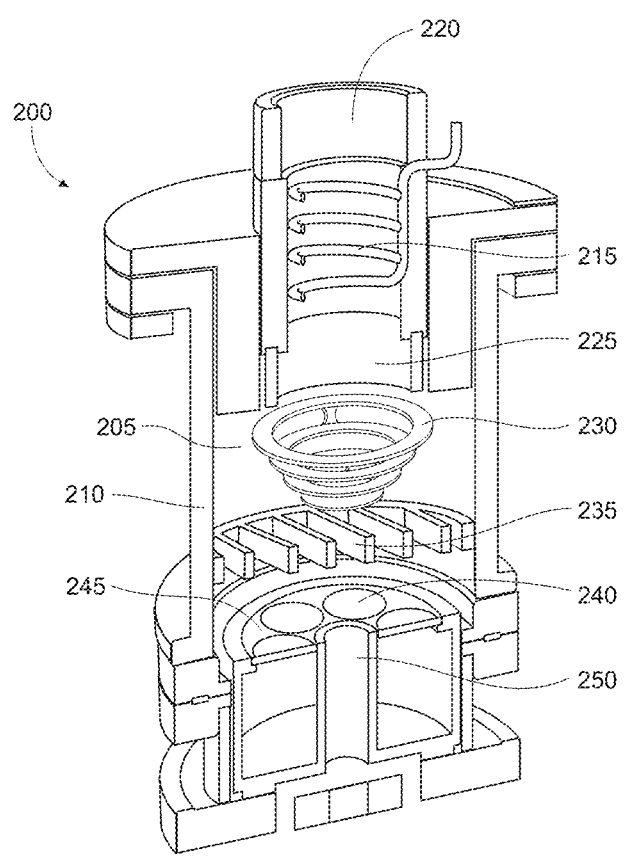
FIG. 2 shows a perspective sectional view of one embodiment of an apparatus for depositing a metal nitride film on a substrate when employing an inverse pagoda baffle and multiple substrates.

FIG. 2 shows a perspective sectional view of one embodiment of an apparatus 200 for depositing a metal nitride film on a substrate which essentially corresponds to the simple representation shown in FIG. 1 but with the use of a baffle and multiple substrates. The apparatus 200 comprises a growth chamber 205 partially formed from outer housing 210.

A plasma generator 215 receives nitrogen through a nitrogen inlet 220 and the active nitrogen plasma formed passes through plasma inlet 225, which once again is remote from the substrates, and into the growth chamber 205 via a baffle 230, which in the embodiment shown takes the form of an inverse pagoda style baffle as described in WO/2010/091470. The plasma passes through the baffle 230 and is evenly distributed by its concentric ring-like structure. The distributed plasma flow then passes over a metal organic injector 235 where the metal organic reagent is introduced and mixes with the plasma. The metal nitride formed will then deposit on one or more of substrates 240 located on a substrate holder 245. The substrate holder 245 may be of a turn table design and so may be rotating at high speed throughout the deposition process. Waste is removed via outlet 250.

It will be appreciated that the central placement of the plasma inlet 225 will likely result in the bulk of the plasma flow being focused on the centre of the substrate holder 245, even with the use of a distribution system such as the inverse pagoda baffle 230. It is critical to quality film growth that the reagents be distributed evenly across the surface of the appropriate substrate 240 and the deficiency in this apparatus 200 will not be solved by rotation of the substrate holder 245. This type of apparatus 200 also does not typically provide the advantages of control over film growth and thickness that is provided by atomic layer deposition (ALD).

Figure 3:
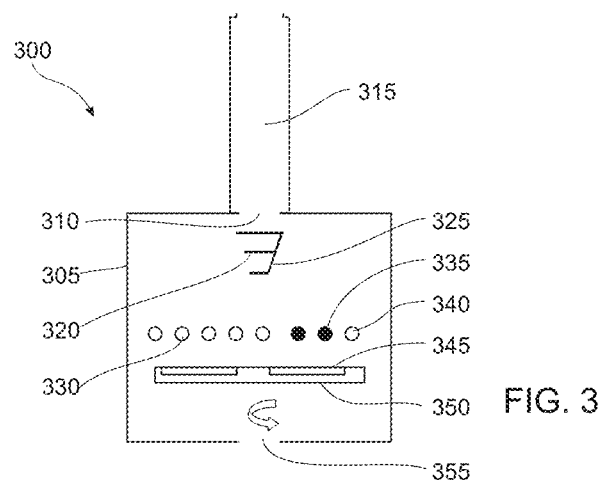
FIG. 3 shows a schematic sectional representation of one embodiment of an apparatus for forming a film according to the present invention.

FIG. 3 shows a schematic representation of one embodiment of an apparatus 300 for forming a film, according to the present invention. The actual components of the apparatus 300 are much the same as those displayed in FIG. 2 but with two notable exceptions being that one region of the baffle is blocked to plasma flow and a number of ports of the Group IIA reagent inlet (referred to herein as the metal organic injector) are either removed or closed to reagent flow.

As for FIG. 2, the apparatus 300 shown in FIG. 3 comprises a growth chamber 305 having a plasma inlet 310 to receive plasma flow comprising active neutral nitrogen species from a plasma generator 315. Although FIG. 3 is merely a schematic representation, the plasma inlet 310 in this embodiment will be located physically closer to the level of the substrates than in the prior art apparatus. The plasma will flow into a baffle 320 which may be of any suitable design but in the embodiment shown has an inverse pagoda shape, as shown in FIG. 2. This time the baffle is provided with a flow barrier 325 formed around one side of the baffle 320 so as to prevent plasma from exiting along that side. This will result in the plasma flow being directed towards the opposite side of the growth chamber 305 from the side of the baffle 320 bearing the flow barrier 325.

The active nitrogen species then pass by a Group IIIA reagent injector in the form of metal organic reagent (e.g. trimethylgallium) injector 330. In FIG. 3, those circles which are black inside represent ports or valves of the metal organic reagent injector 330 which are open to reagent flow i.e. they are open ports 335 while those circles which are white inside (not filled) represent ports or valves of the metal organic reagent injector 330 which are closed to reagent flow i.e. they are closed ports 340. In reality, the parts of the metal organic reagent injector 330 which are represented as closed may simply not be present in the apparatus 300 and so only those regions of the growth chamber 305 having the open ports 335 will actually be provided with a metal organic reagent injector 330 structure.

Located beneath the metal organic reagent injector 330 are a number of substrates 345 which are supported by a substrate holder 350. The substrate holder 350 may hold any desired number of wafers, for example, from 2 to 20 individual substrates, preferably 3 to 10, more preferably 5, 6 or 7. The substrates may have a crystal structure that is suitable for growth of the particular film desired. In particular examples, the substrates 345 may comprise sapphire, SiC, silica, soda lime glass, borosilicate glass, Pyrex®, silicon, glass, synthetic sapphire, quartz, zinc oxide, nitride coated substrates and other materials as are well known in the art including free standing bulk semiconductor substrates and nitride templates. As is indicated by the arrow in FIG. 3, the substrate holder is adapted to rotate relative to the plasma inlet 310 and metal organic reagent injector 330 thereby controlling growth and deposition uniformity. Waste materials may be removed through waste outlet 355.

The combined effect of the directing action of flow barrier 325 on the plasma pathway and the release of metal organic reagent from only those open ports 335, as can be seen from FIG. 3, means that, mixing between the metal organic reagent and plasma species is minimized. Reduction of dead zones within the chamber could be accomplished by arranging the reagent inlets to be flush with the upper surface of the chamber minimizing premature mixing of reagent gasses. The design of the apparatus 300 has thus effected a physical separation of the regions into which plasma and metal organic reagent are released into a first deposition zone and a second deposition zone, respectively, which are substantially isolated from one another. It will be appreciated that rotation of the substrate holder 350 causes the substrates 345 to pass sequentially from the first deposition zone to the second deposition zone in a repetitive, continuous manner to thereby be exposed to the plasma and metal organic reagents, one after the other.

The sequential exposure of each substrate 345 to the metal organic reagent and the active nitrogen species will result in formation of subsequent layers of a film, much in the manner of ALD. However, the formation of separate deposition zones means that the delays experienced in ALD in both waiting for valves to be switched and the removal of one reagent by a purge gas before introduction of the second reagent, are avoided. Instead, the growing surface of the film is exposed to each reagent with a minimum of downtime in between due to the ability of the substrate holder 350 to rotate at very high speeds. This greatly accelerates the growth of the films while maintaining control over sample growth.

The substrate holder 350 may be adapted to rotate continuously. Preferably, the substrate holder is capable of rotating at speeds of between 10-2000 rpm. A preferred rotation speed may be between 25 to 100 rpm, more preferably about 50 rpm. The skilled addressee will understand that film growth will be controlled by a combination of the speed of rotation of the substrate holder 350 and the reagent flow rates in the deposition chamber. Higher rotation speeds of the substrate holder 350 will require a higher flow rate of reagents to ensure an overall increase in the growth rate of the film is produced.

It will be appreciated that although only one plasma inlet 310, and associated baffle 320, and one region of open ports 335 have been shown in FIG. 3 the apparatus 300 may in fact comprise multiples of each component. For example, when looking down on the growth chamber 305 from above the circular substrate holder 350 could be imagined to be split into quadrants with a plasma inlet and associated baffle, if required, sitting above two adjacent or diagonally opposite quadrants and the same relationship for two distinct regions of reagent injector 330 which are open to release of metal organic or other reagent.

It will also be understood that baffle 320 is not an essential feature but may be preferred, under certain process conditions, to prevent or reduce etching due to active nitrogen species which may have relatively high kinetic and/or potential energies. If the baffle 320 was not present in FIG. 3 then some form of structure, such as a shroud, could be used in its place to direct and contain plasma flow to one isolated deposition zone. When the baffle 320 is employed then it may take a variety of forms other than the inverse pagoda style shown which are well known in the art such as a plate with tortured multiple pathways therethrough shower head design etc. Whatever alternate style of baffle is ultimately used it may have either closed pathways or some form of flow barrier or flow directing means to ensure the plasma passes only into a discrete deposition zone and substantially avoids mixing with the other reagent.

The apparatus 300 may further comprise one or more heaters to heat the growth chamber and/or one of the reagent inlets. This may be useful to promote increased reaction rates, assist with quality of the growing film or to break or otherwise activate one or more of the reagents before exposure to the substrates.

As was mentioned above, the present apparatus and method are not particularly limited in the type of reagents suitable for use therein. Any reagents which are suitable for use in ALD may be appropriate. A wide range of reagent classes including, nitrogen plasma, nitrogen/hydrogen plasma, ammonia plasma and metal organics may be suitable. When a metal organic reagent is used then preferred examples include alkyl Group IIIA reagents such as but not limited to one or more of trimethylgallium, trimethylindium, trimethylaluminium as well as employing various well known Mg, Si and Zn precursors as dopant sources.

Figure 4:
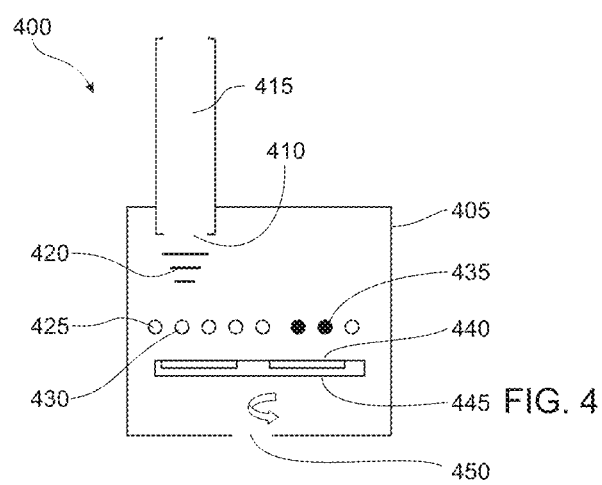
FIG. 4 shows a schematic sectional representation of one preferred embodiment of an apparatus for forming a film according to the present invention.

FIG. 4 shows a schematic representation of one embodiment of an apparatus 400 for forming a film, according to the present invention. The majority of the components are as described for FIG. 3 and so will only be referred to briefly. A growth chamber 405 is provided with a plasma inlet 410, as for FIG. 3 being located relatively close to the substrates, which is continuous with a plasma generator 415. Plasma introduced into the growth chamber 405 will pass through a baffle 420, which again in the embodiment shown is an inverse pagoda style baffle 420, before passing by metal organic reagent injector 425 which has closed ports 430 (circles with white inside) and open ports 435 (circles with black inside). Again, the regions of the metal organic reagent injector 425 having closed ports 430 may simply not be present. A number of substrates 440 are placed upon a substrate holder 445 which rotates relative to the growth chamber 405 and unwanted reactants and reaction products are vented via waste outlet 450.

The key difference in FIG. 4, compared to the embodiment shown in FIG. 3, is the physical location of the plasma inlet 410 and associated baffle 420 relative to the open ports 435. Whereas FIG. 3 showed a modified design whereby a typical central placement of the plasma inlet 310 was manipulated with the additional feature of a flow barrier 325 formed around a portion of the border of the baffle 320, FIG. 4 represents a radical shift in the growth chamber 405 design by comparison to standard ALD set ups.

When looking at a section of the growth chamber 405, as represented in FIG. 4, the plasma inlet 410 and baffle 420 have been shifted to the left hand side of the chamber 405 to form a discrete first deposition zone which is substantially separate from the second deposition zone formed under and adjacent the open ports 435 of the reagent injector 425.

Figure 5:
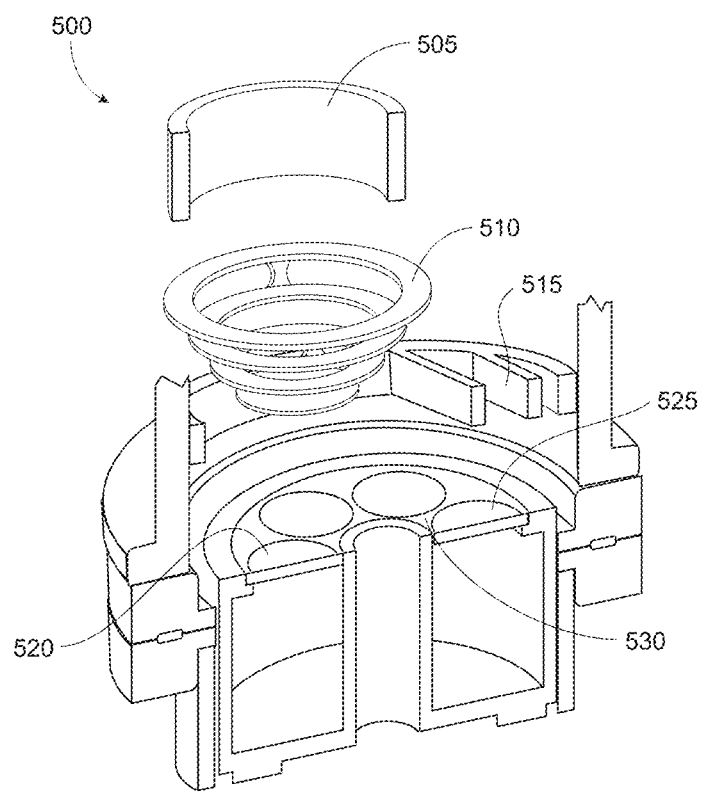
FIG. 5 shows a partial perspective sectional view of the apparatus for forming a film, as represented in FIG. 4.

The schematic representation shown in FIG. 4 is reproduced, in part, in three dimensions in FIG. 5 which shows a partial perspective sectional view of the apparatus 400. For the sake of clarity many of the components of the apparatus 500, such as the housing and high frequency generator, have been removed to focus on the key relationship between plasma inlet 505, baffle 510 and metal organic reagent injector 515.

In the embodiment shown in FIG. 5, as for FIG. 4, the plasma inlet 505 and associated baffle 510 are located peripherally to sit more or less directly above, i.e. adjacent, a first substrate 520 which can therefore be described as being within a first deposition zone receiving active nitrogen species. The baffle illustrated may be replaced with a showerhead or shroud or similar distribution system common to the field. The reagent injector 515 is only disposed on the opposite side of the chamber to the plasma inlet 505, generally above a second substrate 525 and located within a second deposition zone receiving only metal organic reagent, for example trimethylgallium and/or trimethylindium. Thus, as substrate holder 530 rotates the first substrate 520 will have been contacted with a first reagent (in this case active nitrogen species from the plasma) before proceeding out of the first deposition zone and entering the second deposition zone to then be contacted by the second reagent (in this case the metal organic). The second substrate 525, and all substrates located upon the substrate holder 530, will undergo a similar cycle of sequential exposure to one reagent and then the other. This allows epitaxial crystal layers to be deposited sequentially to build up a film with a high degree of control. Alternating the exposure of the substrates to reagents by controlling the speed of rotation of the substrate holder 530 provides for finer control than the rotating, pulsing and purging arrangement employed in ALD.

Although in FIGS. 3 to 5 the plasma and metal organic reagent inlets are shown as being vertically above the substrates it will be appreciated by the person skilled in the art that this is not necessarily the case. For example, the plasma inlet may inject plasma into the growth chamber from the side of the housing i.e. the plasma is injected parallel to the substrates and then proceeds to deposit down upon them. References herein to a plasma inlet or metal organic reagent inlet or additional gas inlet are meant to address the point at which the plasma or plasma activated reactant or metal organic reagent or additional gas enters the reaction chamber proper.

It will be appreciated that in the embodiments described in FIGS. 3 to 5 the two streams of reagents do not, to any notable degree, come into contact with one another. The physical separation of the reagent inlets assists with minimizing reagent mixing such that the amount of oxygen and carbon-based impurities, which may be formed by such mixing and incorporated into the growing films, is reduced compared with a standard ALD or other CVD approach.

However, even employing the approach discussed above it has been found that sufficient amounts of oxygen and carbon impurities are still incorporated in the thin film formed to thereby reduce its quality. The use of RPCVD approaches, while more convenient in many ways than a standard MOCVD approach, are generally accepted in the art as inevitably resulting in moderate levels of oxygen and carbon impurities in the films produced as compared with high end MOCVD produced films. Very low impurity limits can be considered as being at least relatively close to the SIMS detection limits as set out in table 1.

TABLE 1

SIMS detection limits of selected elements in GaN under normal depth profiling conditions

| $O_2$/SIMS Positive Secondary Ion Detection | | $C_s$/SIMS Negative Secondary Ion Detection | | $C_s$/SIMS Positive Secondary Ion Detection ($C_sM+$) | |
| --- | --- | --- | --- | --- | --- |
| Element | Detection Limit (atoms/cm$^3$) | Element | Detection Limit (atoms/cm$^3$) | Element | Detection Limit (atoms/cm$^3$) |
| Be | 1E+14 | H* | 8E+16-2E+17 | Mg | 5E+15 |
| Li | 1E+14 | C* | 5E+15-2E+16 | Zn | 1E+16 |
| B | 1E+15 | O* | 1E+16-3E+16 | | |
| Na | 5E+14 | Si | 3E+15 | | |
| Mg | 5E+14 | As | 5E+15 | | |

*Varies with vacuum conditions

However, the present inventors have found that the levels of these impurities can be lowered significantly by the use of an apparatus as shown in FIGS. 6 to 9.

Figure 6:
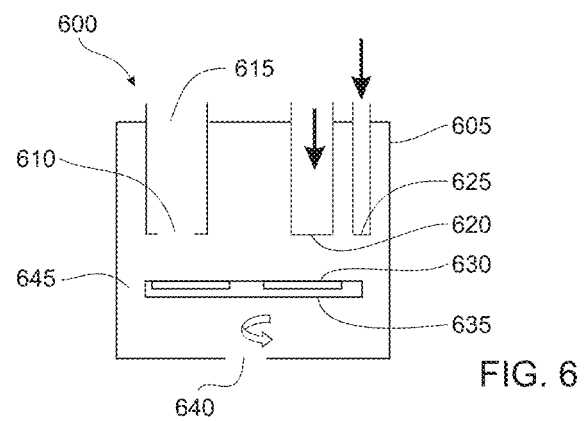
FIG. 6 shows a schematic sectional representation of a highly preferred embodiment of an apparatus for forming a film according to the present invention.
Figure 7:
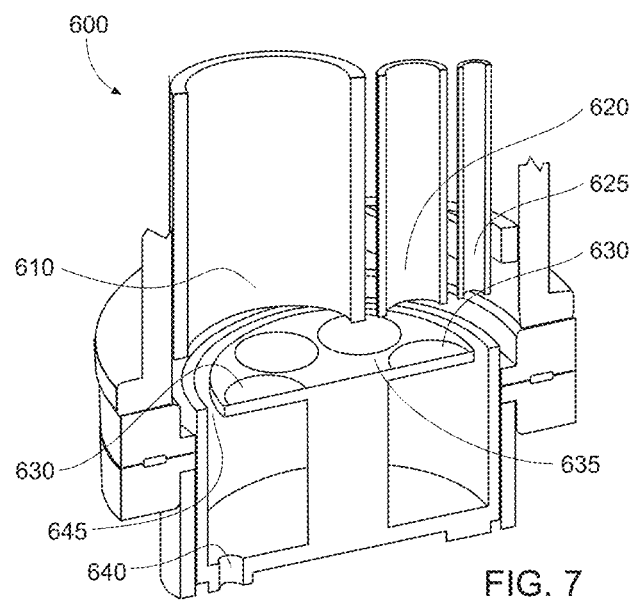
FIG. 7 shows a partial perspective sectional view of the apparatus for forming a film, as represented in FIG. 6.

FIG. 6 shows a schematic sectional representation of one preferred embodiment of an apparatus 600 for forming a film according to the present invention while FIG. 7 is a partial perspective sectional view of the same apparatus 600. The RPCVD apparatus 600 comprises a growth chamber 605 which is provided with a plasma inlet 610. It is clear from FIGS. 6 and 7 that the plasma inlet 610 is physically adjacent to the level of the substrates. The plasma inlet 610 is continuous with a plasma generator 615 (detail not shown).

The growth chamber 605 is also provided with a Group IIIA reagent inlet and, more specifically, in the embodiment discussed herein, a metal organic reagent inlet 620 and an additional reagent inlet which may be a hydrazine inlet, a di-methyl hydrazine inlet or a hydrogen plasma inlet but is preferably an ammonia inlet 625. As was described for FIG. 4 the plasma inlet 610 and metal organic reagent inlet 620 are physically distant forming a first and second deposition zone, respectively, with substrates 630 arranged within each zone by a substrate holder 635 which rotates relative to the growth chamber 605. Unwanted reactants and reaction products are vented via waste outlet 640 to which access is provided by gap 645 provided between the circumference of the substrate holder 635 and the inner walls of the growth chamber 605. The ammonia inlet 625, however, is immediately adjacent the metal organic reagent inlet 620 and so the ammonia will be introduced into the second deposition zone along with the metal organic reagent.

Plasma introduced into the growth chamber 605 will directly contact the substrate 630 placed in the first deposition zone as no baffle, shroud or like blocking or distributing device is in place in the embodiment shown. The present inventors have found that, when using such an apparatus under conditions of relatively low power of the plasma generator (around 500 W to 2500 W) and temperature (about 700° C. to 800° C.) no significant degree of etching was observed. The use of this arrangement with an injection of between about 15 to about 50 sccm ammonia resulted in a substantial reduction of the levels of oxygen and carbon incorporated into the film product.

Further process runs were carried out varying the power output from the plasma generator. At a power output of about 800 W the level of carbon incorporated into the film was reduced to levels approaching the actual detection limit of secondary ion mass spectrometry (SIMS). Oxygen levels have been reduced to those observed using MOCVD wherein oxygen is effectively removed as an impurity of concern. Such a reduction in the levels of oxygen and carbon in RPCVD produced films has hitherto not been shown.

It is envisaged that the method may also include the step of controlling the power of the plasma generator to be between about 500 W to about 5000 W from a single source. This range would be suitable with a growth pressure of 2-3 torr, a nitrogen plasma flow of 2000-3000 sccm and an ammonia flow of between about 15-1500 sccm.

Preferably, the power of the plasma generator is between about 100 watts to about 5000 watts, preferably about 500 to about 3000 W with a nitrogen plasma flow rate of 1000-3000 sccm extending to 100-20000 sccm in a commercial unit. A preferred metal organic reagent flow rate is 1200-2000 sccm which may extend to 100-10000 sccm in a commercial unit. A value for the plasma generator power of about 500 to 1000 W, 500 to 900 W, 500 to 800 W, 600 to 1000 W, 600 to 900 W, 600 to 800 W, 700 to 1000 W, 700 to 900 W and preferably about 800 W is preferred.

Such power levels may be independently coupled with an ammonia injection (in sccm) of between 15 to 1500 sccm. Ranges of between about 15 to 200, preferably 15 to 150, 15 to 100, 15 to 75, 15 to 60, 15 to 50, 15 to 40, 15 to 30, 20 to 150, 20 to 100, 20 to 75, 20 to 60, 20 to 50, 20 to 40, 20 to 35, 20 to 30, 25 to 150, 25 to 100, 25 to 75, 25 to 60, 25 to 50, 25 to 40, 25 to 30, including values of about 15, 20, 25, 30, 35, 40, 45, 50, 55, 60, 65, 70, 75, 80, 85, 90, 95, 100, 120, 140, 160, 180 and 200 sccm have been found to be particularly useful in lowering carbon incorporation for relatively small growth chamber sizes, for example, of dimensions in the order of 7×2". However, in moving to commercial scales higher powers and multiple plasma sites are envisaged as being useful. For growth chambers of larger dimensions of, for example, 56×2" then ammonia injection flows of between about 200 to about 1500 sccm, inclusive of 200 to 1300, 200 to 1100, 200 to 1000, 200 to 900, 200 to 800, 200 to 700, 200 to 600, 200 to 500, 200 to 400, 300 to 1500, 300 to 1300, 300 to 1100, 300 to 1000, 300 to 900, 300 to 800, 300 to 700, 300 to 600, 300 to 500, 300 to 400, 400 to 1500, 400 to 1300, 400 to 1100, 400 to 1000, 400 to 900, 400 to 800, 400 to 700, 400 to 600, 400 to 500, 500 to 1500, 500 to 1300, 500 to 1100, 500 to 1000, 500 to 900, 500 to 800, 500 to 700, 500 to 600, 600 to 1500, 600 to 1300, 600 to 1100, 600 to 1000, 600 to 900, 600 to 800, 600 to 700, 700 to 1500, 700 to 1300, 700 to 1100, 700 to 1000, 700 to 900, 700 to 800, 800 to 1500, 800 to 1300, 800 to 1100, 800 to 1000, 800 to 900, 900 to 1500, 900 to 1300, 900 to 1100, 900 to 1000, 1000 to 1500, 1000 to 1300, 1000 to 1100, are appropriate.

It will be appreciated that higher power output from the plasma generator can be tolerated when a baffle or like device is employed whereas lower values will be preferred when there is an unimpeded flow path between the plasma inlet and the substrates to minimize etching.

Figure 8:
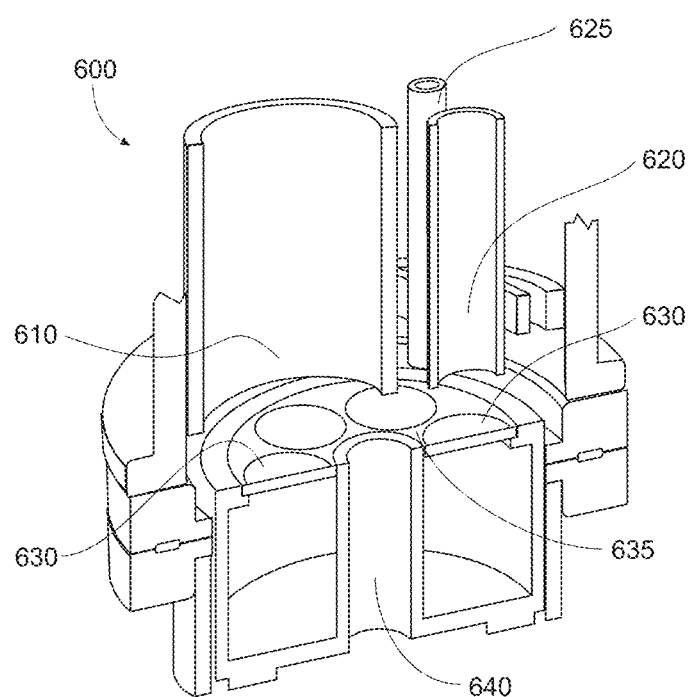
FIG. 8 shows a partial perspective sectional view of an alternative embodiment of the apparatus for forming a film to that shown in FIG. 7.
Figure 9:
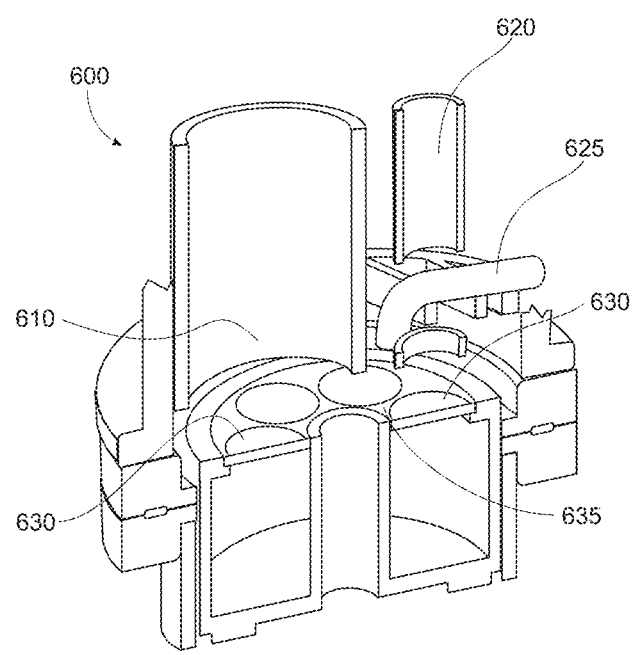
FIG. 9 shows a partial perspective sectional view of an alternative embodiment of the apparatus for forming a film to that shown in FIG. 7.

FIGS. 8 and 9 show partial perspective sectional views of alternative embodiments of the apparatus for forming a film to that shown in FIG. 7. Like parts have been given like numbers between FIGS. 7 to 9 and it will be appreciated that the most important difference is in the placement and/or design of the additional reagent inlet 625, which is preferably an ammonia gas inlet. FIG. 8 also demonstrates an embodiment of the apparatus 600 wherein the waste outlet 640 is actually provided within the hollow centre of the axis about which the substrate holder 635 rotates.

FIG. 8 shows the ammonia reagent inlet 625 placed behind or collinear with the metal organic reagent inlet 620. This is a preferred embodiment as the location of the ammonia reagent inlet 625 is such that the introduced ammonia will be directed more or less to the centre of the substrates as they rotate on the substrate holder 635. This ensures good delivery of the ammonia to the surface of the substrate whereas in the embodiment shown in FIG. 7 the side by side placement of the ammonia reagent inlet 625 and the metal organic reagent inlet 620 means that the ammonia reagent inlet 625 is somewhat offset from being directly vertically above the centre of the rotating substrates.

FIG. 9 represents a slightly different operational set up in that the ammonia reagent inlet 625 enters the growth chamber 605 from the side and so is at more or less a right angle to the substantially vertical metal organic reagent inlet 620. The metal organic reagent inlet 620 has been cut away in FIG. 9 to better show the design of the ammonia reagent inlet 625. On approaching the metal organic reagent inlet 620 the ammonia reagent inlet 625 then has a bend such that its terminal portion finishes vertically and in a similar position to that shown in FIG. 8. The horizontal placement of the ammonia reagent inlet 625 may have operational advantages in use.

Although not shown in FIGS. 7 to 9 in one embodiment it may be preferred that the plasma inlet 610, the metal organic reagent inlet 620 and the ammonia reagent inlet 625 all finish flush with the ceiling of the growth chamber 605. To maintain the inlets close to the substrates the ceiling will therefore be located at a lower level than in a typical RPCVD apparatus. For example, in one embodiment the ceiling may be located approximately less than 30 cm, preferably less than 25 cm, more preferably less than 20 cm, still more preferably less than about 10 cm vertically above the location of the substrates. Values of about 5 cm and 7.5 cm may be useful with 3 cm to 4 cm as the lower end values.

As discussed earlier, the present inventors postulate that it is important for the minimization of carbon and oxygen impurities in the final film to minimize reactions which occur in the gas phase above the substrates. Instead, it is preferable to encourage the key film forming reactions to occur on or as close to the actual substrate surface as possible. Directing the reactions to occur on the substrate surface may improve the scavenging of the oxygen and carbon impurities.

Thus the lowering of the growth chamber 605 ceiling, with reagent inlets formed therein and having their openings flush with said ceiling, results in delivery of the reagents more quickly and effectively to the substrate surface.

Minimizing deadspots and, particularly, optimizing the flow of the plasma and reagents in relation to the substrates are considered in FIGS. 10 to 14 which are further embodiments on the inventive apparatus and method already discussed.

Figure 10:
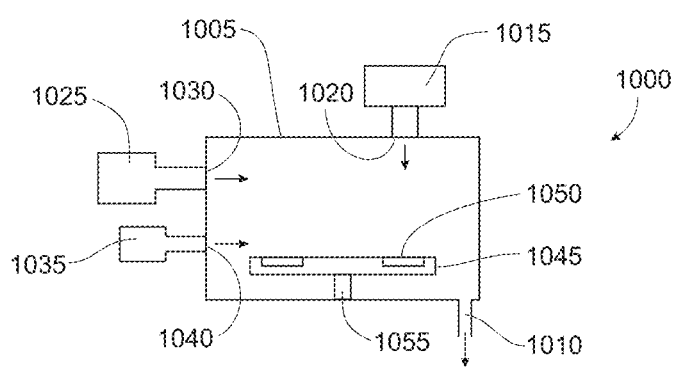
FIG. 10 shows a schematic representation of an RPCVD apparatus for depositing a film on a substrate, according to another embodiment of the invention.

FIG. 10 shows a schematic representation of an RPCVD apparatus 1000 for depositing a film on a substrate, according to one embodiment of the invention. The apparatus 1000 comprises a growth chamber 1005 inside which film growth will occur. An exhaust 1010 is provided at a lower extent of the growth chamber 1005 for the removal of excess reagents and waste products.

A plasma generator 1015 is located externally to the growth chamber 1005 which may be a high frequency generator acting upon nitrogen received from a nitrogen source (not shown). The nitrogen plasma thereby generated enters the growth chamber 1005 at plasma inlet 1020 which ends flush with the ceiling of the growth chamber 1005 i.e. the plasma inlet 1020 does not, to any significant extent, extend into the interior of the growth chamber 1005. The plasma inlet 1020 may, if required, open into a baffle, shroud, impeller or the like to modify the flow path and energy of the plasma. This is not an essential component and the need for such a device will depend upon the power of the radiofrequency generator. A suitable baffle may be as described in the applicant's prior PCT publication WO 2010/091470 which is hereby incorporated by way of reference in its entirety.

A metal organic reagent source 1025 supplies the metal organic reagent which, in a preferred embodiment, is trimethylgallium (TMG) or triethylgallium (TEG). The TMG or TEG enters the growth chamber 1005 via metal organic reagent inlet 1030 which, in the embodiment shown, is located in a side wall of the growth chamber 1005 and ends flush therewith i.e. the metal organic reagent inlet 1030 does not, to any significant extent, extend into the interior of the growth chamber 1005.

A hydrogen-containing, additional reagent source 1035 supplies the additional reagent which, in a preferred embodiment, is ammonia. The ammonia enters the growth chamber 1005 via additional reagent inlet 1040 which, in the embodiment shown, is located in a side wall of the growth chamber 1005, beneath the location of the metal organic reagent inlet 1030, and ends flush therewith i.e. the additional reagent inlet 1040 does not, to any significant extent, extend into the interior of the growth chamber 1005.

Under some conditions it may be preferable that the additional reagent inlet 1040 enters the growth chamber 1005 through a side wall thereof at a height suitable to enable a flow of additional reagent entering therethrough to have a flow path passing over and substantially adjacent to a growth surface of the substrates 1050. It is also beneficial that the positioning of the exhaust 1010 is at an opposite end of the growth chamber 1005 to the additional reagent inlet 1040 which further encourages a flow path of the additional reagent which passes over the surface of the substrates 1050. Thus, the region of injection of the additional reagent and the provision of the exhaust 1010 generally opposite that create an environment whereby the reagent is in constant contact with the growth surface of the substrates 1050 and growing film.

The provision of the three plasma/reagent inlets all with ends flush with either the ceiling (the plasma inlet 1020) or the side walls (the metal organic reagent inlet 1030 and the additional reagent inlet 1040) or a combination thereof avoids the presence of 'dead spots' within the growth chamber 1005. It is preferred that the Group IIIA reagent inlet is flush with the chamber ceiling. It is further preferred that the additional reagent inlet injects the ammonia, or other gas, through entry points, for example view ports, which physically surround the additional reagent inlet to thereby have these two reagents introduced into the growth chamber together to encourage mixing.

The presence of inlets which extend into the growth chamber 1005 would result in adjacent regions therein where reagents can collect and be moved around in vortex like movements, due to the spinning of substrate holder 1045. Dead spots are considered to be unwanted volumes within the growth deposition chamber where there could be depletion or recirculation of gas which does not help with the growth of the film. This would encourage reaction pathways other than the desirable adduct formation outlined above and would result in TMG or TEG degradation with methyl radical production.

The substrate holder 1045 may be adapted to support a single substrate 1050 but it is preferred that it is of a design adapted to support multiple substrates 1050. Suitably, the substrate holder 1045 is rotatable.

The design of the apparatus 1000 shown in FIG. 10 is one preferred embodiment in that the plasma inlet 1020 and metal organic reagent inlet 1030 are substantially separated to thereby avoid any potential degradation of the TMG/TEG or other metal organic by the high energy plasma stream.

As discussed previously, the ceiling height of the growth chamber 1005 is preferably lowered with respect to a standard RPCVD set up. Suitable heights have been set out previously. This helps minimize undesirable non-adduct forming reactions by minimizing the space in which they can occur due to the placing of the plasma and reagent inlets close to the substrates 1050.

Although not shown in FIG. 10, the apparatus 1000 may further comprise one or more heating devices to heat the additional reagent inlet 1040 and/or the metal organic reagent inlet 1030 prior to the reagents entering the growth chamber 1005. The heating devices may take the form of external heaters surrounding the transport members running between the relevant source and its inlet. Simple heating coils or heating tape placed around the piping may suffice. The heating of, particularly, the ammonia introduced above the substrate 1050 surface means that it is introduced in an activated state, in anticipation of adduct formation, in the key reaction zone above the substrates 1050.

Although not shown for the sake of simplicity, the growth chamber 1005 may comprise one or more structures associated with the additional reagent inlet 1040 and/or the metal organic reagent inlet 1030 to promote mixing of said reagents immediately prior to their contacting the one or more substrates 1050. Particularly, it may be desirable to generate some turbulence in the flow path of the introduced additional reagent, preferably being ammonia. Since this reagent is introduced to generate a flow path just above the substrates 1050 this ensures rapid and efficient mixing with the TMG or TEG to promote adduct formation prior to contact with the growth surface of the growing film.

The structures themselves may take the form of a baffle-like structure, vanes or any shape which promotes flow turbulence. They may be in direct contact with the corresponding reagent inlets or may be operatively associated with them such that the reagent must flow through the structure before passing close to the substrates 1050.

Figure 11:
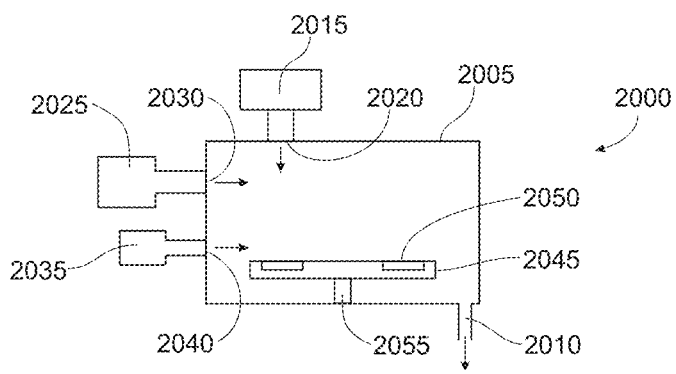
FIG. 11 shows a schematic representation of an alternative RPCVD apparatus for depositing a film on a substrate to that shown in FIG. 10.

FIG. 11 shows an alternative schematic representation of an RPCVD apparatus 200 for depositing a film on a substrate to that shown in FIG. 10. Similar numbering to the apparatus 1000 of FIG. 10 has been maintained for like parts and it will be apparent that all of the growth chamber 2005, exhaust 2010, plasma generator 2015, plasma inlet 2020, metal organic reagent source 2025, metal organic reagent inlet 2030, additional reagent (ammonia) source 2035 and additional reagent inlet 2040 are present to supply necessary reagents to the substrates 2050 supported on substrate holder 2045 which rotates around central pivot 2055.

The key difference between the embodiments of FIGS. 10 and 11 is that in FIG. 11 the plasma inlet 2020, and associated plasma generator 2015, has been shifted to be closer to the side wall in which the metal organic reagent inlet 2030 and additional reagent inlet 2040 are provided. Although less preferred than the embodiment in FIG. 10 due to the close proximity of TEG or TMG reagent and plasma, this design of apparatus 2000 may still provide a significant improvement in the purity of the growing films over those grown in a typical RPCVD apparatus. There may be advantages in the directing of the plasma directly onto the region of the growth chamber 205 in which the TEG or TMG and ammonia are encouraged to mix. All other components and reagents in the apparatus 2000 may be as described for apparatus 1000 in FIG. 10.

Figure 12:
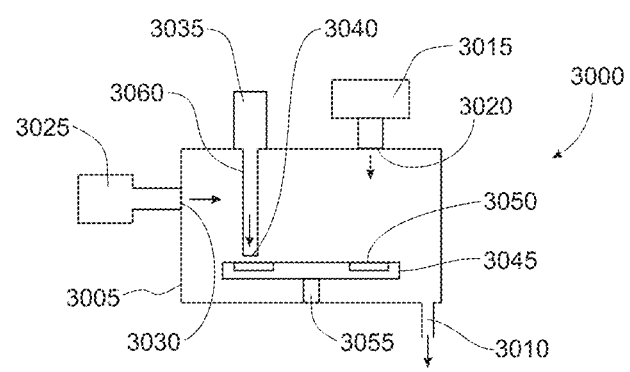
FIG. 12 shows a schematic representation of a further alternative RPCVD apparatus for depositing a film on a substrate to that shown in FIG. 10.

FIG. 12 shows a further alternative schematic representation of an RPCVD apparatus 3000 for depositing a film on a substrate to that shown in FIG. 10. Once again the components of the apparatus 3000 are substantially the same as those discussed in relation to FIGS. 10 and 11 and so will not be repeated here. The key differences between the embodiments of FIGS. 12 and 10 are that, firstly, the additional reagent source 3035 and associated additional reagent inlet 3040 are located on the ceiling of the growth chamber 3005, rather than a side wall as in FIG. 10, and secondly, to ensure the introduction of additional reagent e.g. ammonia, into the growth chamber 3005 only at a point close to the substrates, the additional reagent inlet 3040 is provided with an extended portion 3060. Although not shown in the figures a temperature regulating means may be provided generally adjacent extended portion 3060 to control the reagent temperature before contact with the growth surface.

The provision of the extended portion 3060 does result in the potential generation of one or two "dead spots" as discussed before but this does not prevent the formation of an improved film product compared with many prior art RPCVD approaches. The design of the apparatus 3000 still ensures that the ammonia, or other additional reagent, is only provided in close proximity to the growing film such that adduct formation and the production of methane, as opposed to methyl radicals, is promoted immediately adjacent said film.

Figure 13:
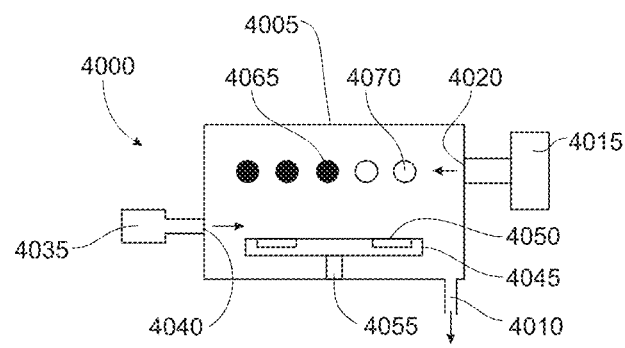
FIG. 13 shows a schematic representation of yet a further alternative RPCVD apparatus for depositing a film on a substrate to that shown in FIG. 10.

FIG. 13 shows yet a further alternative schematic representation of an RPCVD apparatus 4000 for depositing a film on a substrate to that shown in FIG. 10. Once again like numbering is employed for like components to those in FIG. 10. In this embodiment the plasma generator 4015 and associated plasma inlet 4020 are found in a side wall opposite that in which the additional reagent inlet 4040 is located. Further, instead of the representation of a metal organic reagent inlet as a single inlet it takes the form of an injector framework. The framework may be operative over the entire area of the growth chamber 4005 occupied by the substrates 4050 but, preferably, the injector framework will have open ports 4065 and closed ports 4070. The closed ports 4070 may be those adjacent the plasma inlet 4020 to protect the TEG or TMG or other metal organic reagent from exposure to high energy plasma as it exits the plasma inlet 4020.

Figure 14:
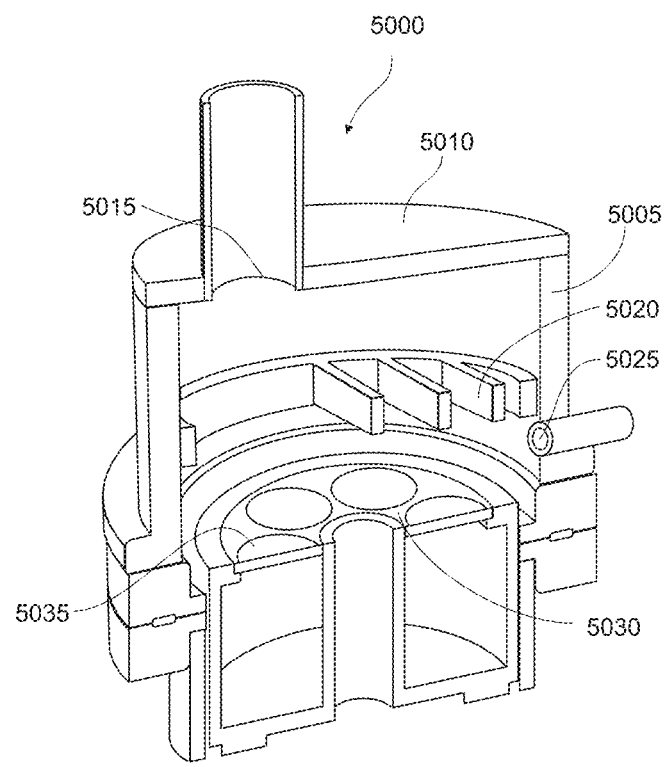
FIG. 14 shows a partial perspective sectional view of an apparatus for forming a film, according to a further embodiment of the present invention.

FIG. 14 shows a partial perspective sectional view of an RPCVD apparatus 5000 for forming a film, according to one embodiment of the present invention. For the sake of clarity not all components, such as the plasma generator and reagent sources, have been shown but rather only those components required to convey the key aspects of the apparatus.

The growth chamber 5005 is defined, in part, by the ceiling 5010 which, in relative terms, is not very distant from the substrates 5035 to minimize the chamber mixing space. A plasma inlet 5015 opens into the growth chamber 5005 through the ceiling 5010 to deliver a plasma, such as a nitrogen plasma. A metal organic reagent inlet takes the form of an injector framework 5020 (details of the port openings not shown) while a additional reagent inlet 5025 opens into the growth chamber 5005 through a side wall thereof at a point underneath the metal organic injector framework 5020 and a height such that a flow path of a additional reagent, preferably ammonia, is created just above the growth surface of the substrates 5035 which are rotating with the movement of the substrate holder 5030.

The design in FIG. 14 represents a further variation on the themes discussed in relation to the previous figures and achieves its advantages in much the same way. The embodiment shown in FIG. 14 does have the advantages of the plasma inlet 5015 and TEG or TMG injector framework 5020 being separated and, other than the relatively small size of the injector framework 5020 itself, minimal structural components being located within the growth chamber 5005 above the substrates 5035. By these means degradation of the TEG or TMG and the creation of "dead spots" which might promote the methyl radical production pathway are minimized.

It will be appreciated that, in one embodiment, the additional reagent may only need to supply hydrogen in a reactive form if the plasma is a nitrogen plasma and so can be used as the nitrogen source for adduct formation. This would result in the use of a hydrogen plasma generator and inlet along with a nitrogen plasma generator and inlet. Due to the possibility of arcing between these components it would be preferable to physically separate them as much as possible and so one may be located in the ceiling at one end of the growth chamber 5005 and the other in a side wall at an opposite end of the growth chamber 5005.

Although the discussion herein has been of rotation of the substrate holder it will be appreciated that it may be possible for the substrate holder and substrates to remain stationary while the plasma inlet and reagent inlets spin within the growth chamber. This will require a design whereby a rotatable connection mates with each of the plasma inlet, the metal organic reagent inlet and the additional reagent inlet which will both be operated in pulses timed to coincide with the rotation speed to ensure that each is only dispersed where required. Such a design would present greater challenges in operation over those disclosed in the figures which have the substrate holder rotate while the plasma inlet and reagent inlets remain stationary and, hence, is a less preferred approach.

The apparatus may also be adapted to allow additional individual rotations of each substrate relative to the substrate holder for further improvement of thin film growth uniformity.

Thus, from the various embodiments described above, it will be appreciated that the components of the inventive apparatus described herein may be arranged in a number of different ways while still achieving a reduced carbon and/or oxygen level in the growing films compared with that achieved by standard RPCVD approaches. However, all of the embodiments described share at least the feature of the additional reagent being introduced to the growth chamber in close if not immediate proximity to the Group IIIA reagent introduction point and, preferably, the substrates to promote formation of the adduct directly above the growing film surface. This approach has been found to greatly reduce the level of carbon and/or oxygen incorporation into the film. Further common features which assist in further reducing the level of carbon and/or oxygen incorporation include a low chamber ceiling height and therefore a correspondingly reduced chamber volume along with provision of reagent inlets which end flush with the ceiling and/or side walls to minimize dead spots and positioning of the exhaust to encourage a flow path of additional reagent over the substrate surface.

In one highly preferred embodiment of the present invention any one or more and most preferably all of the Group VA plasma inlet, the Group IIIA reagent inlet and the additional reagent inlet all end flush with the ceiling of the growth chamber, as previously discussed. However, if the Group IIIA reagent inlet and the additional reagent inlet are to extend into the chamber then, in one embodiment, it is useful if they extend into the chamber to be between about 1 to about 10 cm vertically above the substrates inclusive of between 2 to 9 cm, 3 to 6, cm and 4 to 5 cm.

The process of film formation as described in relation to any of the aspects herein may also include a doping step, which may be necessary for films to be employed in devices such as LEDs and solar cells. Preferably, the doping step is a p-type doping step. For p-type doping, the dopants could be Mg or Zn or other suitable elements. Suitable reagents that contain these elements, such as diethyl zinc (DEZn), bis(cyclopentadienyl)magnesium (Cp2Mg) can be selected from those known in the art for p-type doping. p-type doping is known in the art to be particularly challenging but it has been found that the present set of process conditions and apparatus features used to reduce carbon impurities in the growing film also allow for better p-type doping. Values obtained for p-type doping (Hall measurements) are: resistivity of 0.9 Ohm-cm, mobility of 2.7 cm^2/Vs for a carrier concentration of 1.4E18 cm^-3. For n-type doping, the dopants could be Si or oxygen or other suitable elements. Suitable reagents that contain these elements, such as silane, disilane, di-tert-butylsilane, oxygen can also be used for n-type doping.

It will be appreciated from the foregoing discussion that a number of other factors can be controlled to further contribute to the extent of the reduction of impurities achieved in the film product.

For example, the method may further include the step of controlling the temperature to be between about 400 to about 1200° C., preferably between about 500 to about 1000° C. (inclusive of a temperature of about 500° C., 600° C., 700° C., 800° C., 900° C. or 1000° C.), more preferably between about 500 to about 850° C. This is a relatively low temperature range in comparison to typical MOCVD and even many RPCVD approaches. The lower temperatures favour adduct formation over TMG thermal degradation and so reduce methyl radical reactions at the film surface.

The method may further include the step of promoting the mixing of the metal organic reagent and the additional reagent adjacent the one or more substrates using a flow perturbation device. Once again, the mixing step is to promote immediate formation of the adduct in the vicinity of the film/substrate surface.

It has been found that the power of the plasma generator has an effect on carbon incorporation into the thin film and so the method may also include the step of controlling the power of the plasma generator to be between about 400 W to about 5000 W from a single source. Preferably, the power of the plasma generator is between about 500 to about 3000 W, 500 to 2750 W, 500 to 2500 W, 500 to 1000 W, 500 to 900 W, 500 to 800 W, 600 to 1000 W, 600 to 900 W, 600 to 800 W, 700 to 1000 W, 700 to 900 W and preferably about 800 W is preferred. A value of about 800 W has been found to be particularly useful in lowering carbon incorporation, however, in moving to commercial scales higher powers and multiple plasma sites are envisaged as being useful such as about 2500 W.

Although not wishing to be bound by any particular theory, it is postulated that the surprising results achieved may be as a result of one or more of the following processes. Firstly, it is postulated that the injection of ammonia provides additional available nitrogen to the system and this acts as both a reagent in film formation and also as a scavenger for oxygen and/or carbon. Secondly, it is theorized that the improvement in lowering carbon incorporation into the film when the power output of the plasma generator is increased could be due to the carbon atoms being actively removed in favour of nitrogen. Thirdly, and as alluded to previously, a proposed mechanism for removal of carbon from the system is that the ammonia assists in the formation of an adduct with the trimethylgallium, i.e. initially $(CH_3)_3Ga:NH_3$, which subsequently releases a methane molecule. The methane is not incorporated into the film as readily as a $CH_3$ radical may be. Subsequent decomposition of the adduct releases further methane until all of the carbon of the trimethylgallium has been removed as methane and only GaN is left. It is believed formation of this adduct and subsequent decompositions are occurring at the surface of the substrate. Finally, it is possible that the improved lowering of carbon and oxygen incorporation upon removing the baffle from the system is a consequence of the energy from the UV light emitted from the plasma generator/plasma chamber contacting the growing film ejecting carbon and/or oxygen in favour of nitrogen. In reality, it is possible that all of these mechanisms may play at least some role in providing the results achieved.

In a third aspect the invention resides in a method of forming a thin film having a carbon content of less than about 5E+17 atom/cm$^3$, on a substrate by RPCVD including the steps of:
  (a) introducing a Group VA plasma through a Group VA plasma inlet into a first deposition zone of a growth chamber wherein a direct flow path is provided between the Group VA plasma inlet and a substrate located in the first deposition zone;
  (b) introducing a Group IIIA reagent through a Group IIIA reagent inlet into a second deposition zone of the growth chamber, the second deposition zone being substantially isolated from the first deposition zone;
  (c) introducing an additional reagent selected from the group consisting of ammonia, hydrazine, di-methyl hydrazine and hydrogen plasma through an additional reagent inlet into the second deposition zone such that the additional reagent and the Group IIIA reagent mix prior to deposition;
  (d) moving the substrate between the first and second deposition zones,
  to thereby form a thin film on the substrate having a carbon content of less than about 5E+17 atom/cm$^3$.

Preferably, the carbon impurity content is less than about 3E+17 atom/cm$^3$, even more preferably less than about 2E+17 atom/cm$^3$, yet more preferably less than or about 1E+17 atom/cm$^3$. A lower limit may be considered to be about the SIMS detection limit for carbon impurities in such films.

In one embodiment, the thin film also has an oxygen impurity content of less than about 8E+17 atom/cm$^3$, even more preferably less than about 6E+17 atom/cm$^3$, yet more preferably less than about 4E+17 atom/cm$^3$, still more preferably less than about 2E+17 atom/cm$^3$, or even less than or about 1E+17 atom/cm$^3$. A lower limit may be considered to be about the SIMS detection limit for oxygen impurities in such films.

The statements made above in relation to the second aspect apply equally well to the third aspect.

In a fourth aspect the invention resides in a film made by the method of the second or third aspects. Such films will have demonstrably lower levels of oxygen and/or carbon incorporated into their structure in comparison to similar films made by standard RPCVD approaches. In one embodiment, films produced by the method of the present invention may have a carbon content of less than about 10E+16 atoms/cm$^3$. Values of 3E+16 atoms/cm$^3$ have been attained and it is believed that values of less than 1 E+16 atoms/cm$^3$ are attainable with process optimization.

In a fifth aspect the invention resides in use of a film of the fourth aspect in a semiconductor device.

The examples set out in further detail the process runs using the apparatus of the invention and the results thereby obtained. In the examples nitrogen was used as the Group VA plasma and trimethylgallium as the Group IIIA reagent.

EXAMPLES

Process Runs with Baffle

An apparatus essentially as set out in FIGS. 6 and 7 was used employing a stainless steel style shower head baffle located below the plasma inlet. The power of the plasma generator was between 500 W to 600 W and a growth temperature of 700° C. was employed. The films were grown onto a GaN template. An initial control run was carried out using a nitrogen plasma and trimethylgallium (TMG) as the organometallic reagent but without the injection of any ammonia. This produced a film as would be expected when made via the apparatus of FIG. 2 i.e. with standard levels of oxygen and carbon impurities.

A second run was then carried out under essentially similar conditions but with an injection of a 15 sccm ammonia flow into the second deposition zone (the organometallic reagent deposition zone). The ammonia was injected at the same time as injection of the TMG so that the two mixed together prior to deposition. This produced a film with a substantial reduction in the levels of both oxygen and carbon. Specifically, compared with the first run without the injection of ammonia, the level of carbon decreased from about 6E+20 atom per cubic centimetre (atom/cc) to about 3E+20 atom/cc while the level of oxygen decreased from about 3E+20 atom/cc to about 1E+17 atom/cc.

The figure of 1E+17 atom/cc for the oxygen level represents an extremely surprising result in that it ceases, for practical purposes, to be a problematic impurity at that level and the result is comparable to that observed using MOCVD. Although the additional hydrogen provided by the ammonia may be expected to provide some benefit in reducing carbon and oxygen impurities it could not have been predicted, based upon accepted wisdom in the semiconductor field, that such a small injection of ammonia could result in such a large reduction in oxygen and carbon impurities.

Figure 15:
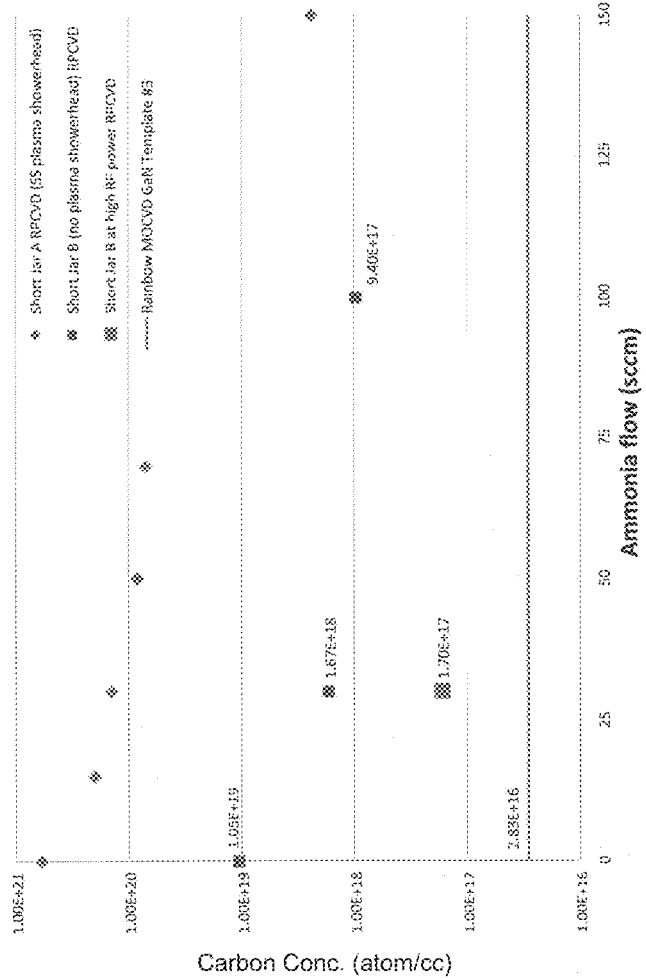
FIG. 15 is a graphical representation of the carbon levels incorporated into films under varying conditions.

This experiment was repeated using different flow rates of ammonia. The results of these process runs, in terms of carbon incorporation into the film, are shown in FIG. 15 wherein the diamond icons (labeled 'Short Jar A RPCVD') indicate the levels of carbon in the film.

Process Runs without Baffle

A number of runs were then carried out using the same apparatus and conditions as described above but with the shower head baffle removed. Thus, a direct flow path between the plasma generator, plasma inlet and substrates was established in the first deposition zone.

The distance between the plasma inlet and the substrates was less than 20 cm and no plasma etching was observed. It is postulated this may be due to the relatively low (500-600 W) power output from the plasma generator employed while still providing enough energy to activate the nitrogen.

The results of this run are indicated on FIG. 15 as the smaller square icons (labeled as 'Short Jar B(no plasma showerhead) RPCVD'). It was observed that, under the same conditions as process runs using the shower head baffle and using the same amounts of ammonia, the levels of carbon incorporated into the film was greatly reduced.

A further process run was carried out under identical conditions (30 sccm ammonia) but with the power of the plasma generator increased to 800 W. Once again, surprisingly, the resulting film was not etched to a significant degree. More surprising, however, was that the level of carbon incorporated into the film was about 1.7E+17 atom/cc. This result is indicated on FIG. 15 as a single point larger square icon. The results for the levels of carbon found in films produced by all of the process runs described above, and as indicated graphically in FIG. 15, are shown in table 2.

TABLE 2

Levels of carbon incorporated into films grown under a variety of conditions

| NH3 flow (sccm) | Standard RPCVD | RPCVD A | RPCVD B | RPCVD B higher RF power (800 W) | Standard MOCVD |
|---|---|---|---|---|---|
| 0 | 4.10E+19 | 6.00E+20 | 1.05E+19 | | 2.83E+16 |
| 15 | | 2.00E+20 | | | 2.83E+16 |
| 30 | | 1.40E+20 | 1.67E+18 | 1.70E+17 | 2.83E+16 |
| 50 | | 8.50E+19 | | | 2.83E+16 |
| 70 | | 7.00E+19 | | | 2.83E+16 |
| 100 | | | 9.40E+17 | | 2.83E+16 |
| 150 | | 2.44E+18 | | | 2.83E+16 |

It will be appreciated that there will be an upper limit to the plasma generator power which can be employed without etching occurring. If this point is reached and further increases in plasma generator power are desirable then a baffle may once again be placed between the plasma inlet and the substrates.

Further runs designed to optimize the process have resulted in levels of 3E+16 atom/cc of carbon and 3E+16 atom/cc of oxygen in the grown GaN films. It may assist the appreciation of how low these levels are by considering that the SIMS detection limits for carbon are between about 1-2E+16 and between about 1-3E+16 for oxygen. At the above quoted optimal results the present films are approaching the detection limits for carbon and oxygen. SIMS is one of the most sensitive surface analysis techniques available, being able to detect elements present in the parts per billion range, and is the accepted standard for analysis in this field. The low levels of carbon and oxygen impurities achieved by use of the present apparatus and method are comparable with those observed in GaN templates and have never been seen previously using RPCVD.

The data in table 2 also indicates that ammonia actively takes part in GaN formation and carbon removal rather than just scavenging carbon and/or oxygen.

Figure 16:
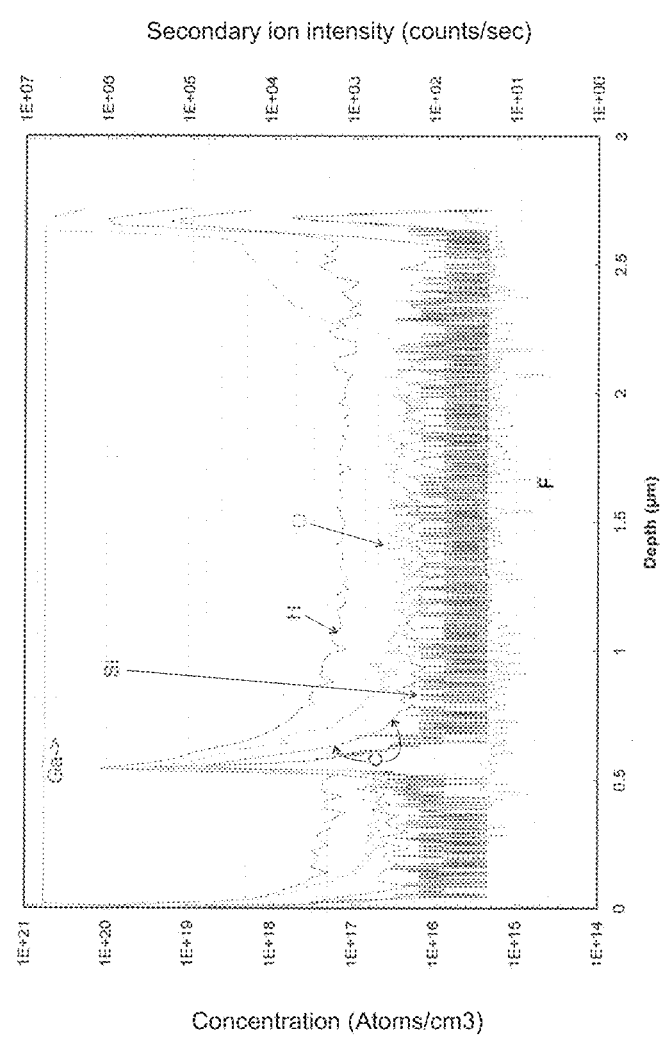
FIG. 16 is a SIMS graphical analysis of the typical impurities found in a film produced by a method and apparatus of the invention and an underlying GaN template.

FIG. 16 is a SIMS graphical analysis of the typical impurities found in a film produced by a method and apparatus of the invention as described and grown on a GaN template. Films produced by RPCVD would usually not be comparable with the purity levels achieved in a template, however, in the present instance when formed under the optimal conditions described above it is seen that the films are essentially of equal quality.

The first 0-0.5 μm of the depth profile (indicated on the x axis) represents a film produced by the present apparatus and method while the 0.5-2.7 μm component represents the underlying GaN template produced by an MOCVD process. It is clear that the levels of the various impurities, particularly carbon and oxygen, are similar. The spikes observed in the traces are representative of the interfaces between layers or changes in growth conditions and not an increase in impurity levels.

Triethyldallium Experiments

A further series of experiments were performed using triethylgallium (TEG) as the Group IIIA reagent and investigating different ammonia injection rates. The process conditions used for these experiments are set out below in table 3. Also noteworthy is that the plasma inlet, TEG inlet and ammonia inlets all ended flush with the growth chamber ceiling to reduce recirculation of gases i.e. deadspot effects. The ceiling was fixed at a height approximately 5.0-7.5 cm above the substrates and the speed of rotation of the substrate holder was 1200 rpm.

TABLE 3

Process conditions for growth runs using TEG

| Run # | Time (min) | TEG | MO inj. | N2 PL (2 + 3) | H2 Shrd | NH3 0.25 L | Growth Temp | Press (Torr) | RF power (W) |
|---|---|---|---|---|---|---|---|---|---|
| 1380 uGaN | 120 | 120 | 1600 | 2500 | 800 | 30 | 720 | 3.5 | 2500 |
| 1386 uGaN | 120 | 120 | 1600 | 2500 | 800 | 0 | 720 | 3.5 | 2500 |
| 1388 uGaN | 120 | 120 | 1600 | 2500 | 800 | 100 | 720 | 3.5 | 2500 |

N2 PL (2 + 3) is the nitrogen flow to the plasma inlet.
H2 Shrd is the hydrogen flow to the chamber through an outer shroud.
MO inj. is the metal organic injector flow of hydrogen which carries the metal organic reagent.
NH3 0.25 L is the ammonia flow into the growth chamber in sccm.

Figure 17:
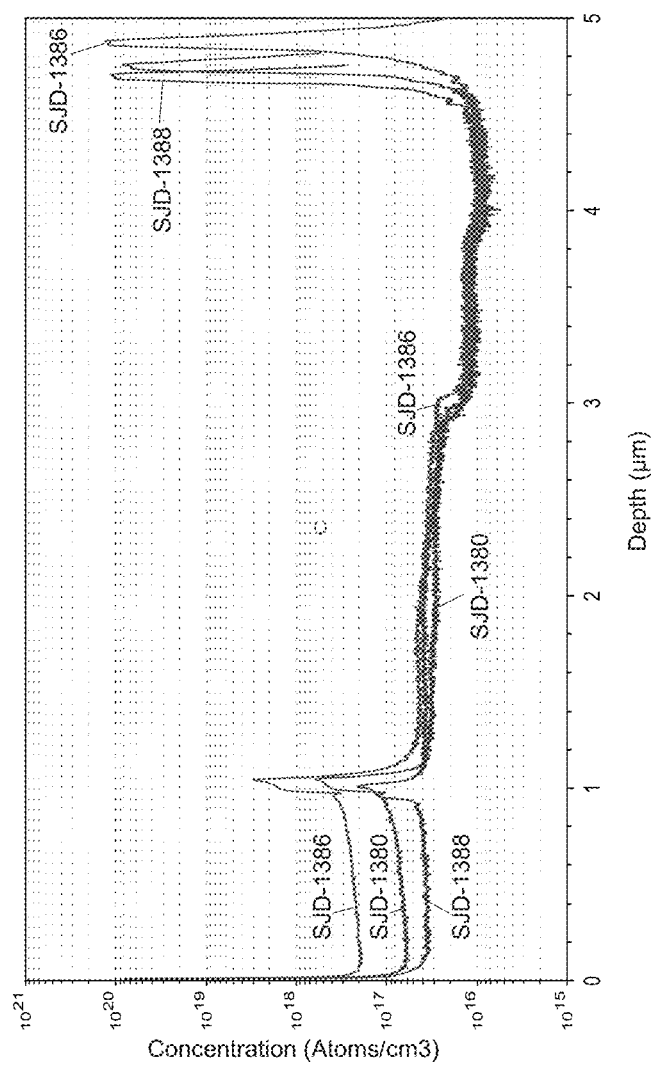
FIG. 17 is a SIMS graphical analysis of the level of carbon, as an impurity, found in a film produced by a method and apparatus of the invention on an underlying GaN template with varying ammonia flow rates.

The results of the experiments set out in table 3, in terms of the carbon and oxygen impurity levels in the grown films, are shown graphically in the SIMS data in FIGS. 17, for carbon, and 18, for oxygen. The grown films were approximately 1 μm thick and were grown on top of GaN MOCVD templates. The thickness of the as grown films means that the SIMS data only needs to be viewed from the left side of the x-axis on the data plots up until the 1 um depth point. The spike at this region is due to the interface between the films and the template.

It can be seen from FIG. 17, firstly, that the injection of increasing amounts of ammonia causes a very significant decrease in the levels of carbon as an impurity in the grown films when compared with the baseline levels with no ammonia injected (run no. 1386). The injection of 30 sccm of ammonia brings the level of carbon impurities down to under $10^{17}$ atoms/cm$^3$ while, with an injection of 100 sccm of ammonia the level of carbon impurities is seen to actually be reduced to more or less correspond to those in the MOCVD generated GaN templates, a result hitherto unseen when employing RPCVD growth of GaN films.

Figure 18:
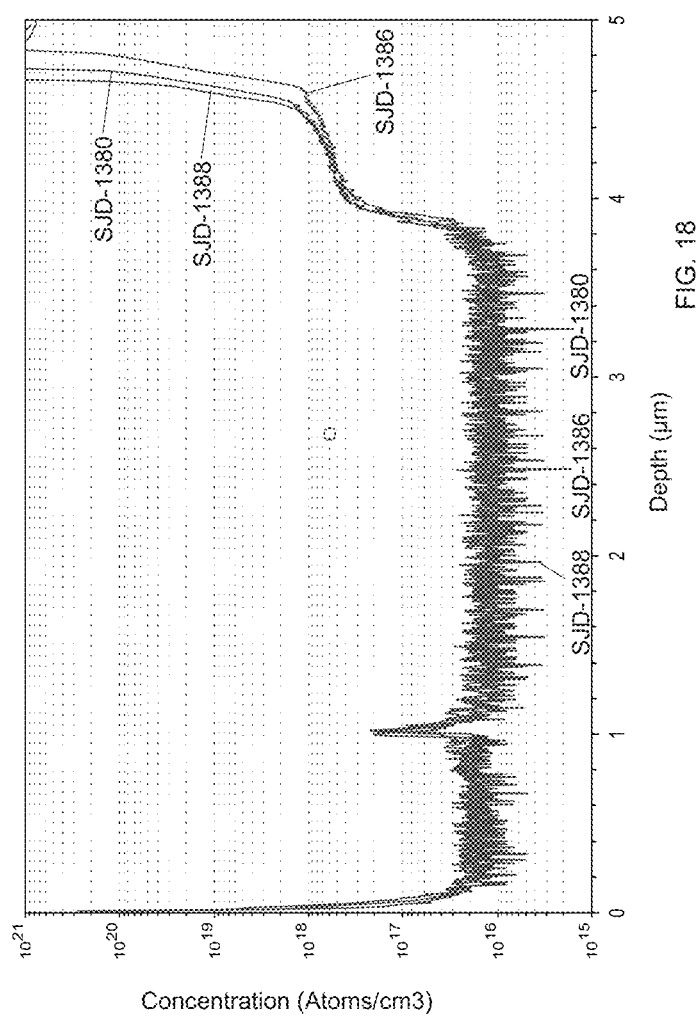
FIG. 18 is a SIMS graphical analysis of the level of oxygen, as an impurity, found in a film produced by a method and apparatus of the invention on an underlying GaN template with varying ammonia flow rates.

FIG. 18 shows that the oxygen impurity levels in the grown films were on a par with those observed in the MOCVD grown GaN template under all conditions.

It will be appreciated from all of the foregoing that the use of separate deposition zones in an RPCVD arrangement can be useful in reducing impurity incorporation into films, such as GaN films, however these impurities will still be found in the produced films in noticeable quantities. The use of a growth chamber arrangement whereby the plasma inlet and/or organometallic reagent inlet are between about 1 to about 30 cm vertically above a growth surface of the substrates. However, the introduction of relatively small quantities of ammonia into the second deposition zone, simultaneously with the organometallic reagent, has been shown to dramatically reduce the level of oxygen and, particularly, carbon in the film. Under similar conditions but with the removal of any impediment to direct flow between the plasma generator and/or plasma inlet and the substrates results in an extremely surprising reduction in the incorporation of, particularly, carbon into the film. As a further level of control it has been shown that increasing the power of the plasma generator output can further lower the level of carbon impurities found in the film.

Throughout the specification the aim has been to describe the preferred embodiments of the invention without limiting the invention to any one embodiment or specific collection of features. It will therefore be appreciated by those of skill in the art that, in light of the instant disclosure, various modifications and changes can be made in the particular embodiments exemplified without departing from the scope of the present invention.

The invention claimed is:

1. A method of forming a thin film on a substrate by RPCVD including the steps of:
   a. introducing a nitrogen plasma through a nitrogen plasma inlet into a first deposition zone of a growth chamber;
   b. introducing a Group IIIA metal alkyl organic reagent through a Group IIIA reagent inlet into a second deposition zone of the growth chamber, the second deposition zone being substantially isolated from the first deposition zone;
   c. introducing ammonia through an additional reagent inlet into the second deposition zone such that the ammonia and the Group IIIA metal alkyl organic reagent mix prior to deposition; and
   d. moving the substrate between the first and second deposition zones, to thereby form the thin film on the substrate,
      wherein the nitrogen plasma introduced into the first deposition zone provides substantially all active nitrogen required for formation of the thin film on the substrate, and
      wherein the substrate is a 7×2" wafer arrangement and the ammonia is introduced at a relative flow rate of between about 160 to 250 sccm for this 7×2" wafer arrangement in the growth chamber.

2. The method of claim 1 wherein the ammonia is introduced into the second deposition zone substantially adjacent the opening of the Group IIIA inlet.

3. The method of any claim 1 wherein the ammonia and the Group IIIA metal alkyl organic reagent are introduced into the growth chamber simultaneously.

4. The method of claim 1 wherein the nitrogen plasma comprises active nitrogen species.

5. The method of claim 1 further including the step of promoting the mixing of the Group IIIA metal alkyl organic reagent and the ammonia adjacent the one or more substrates.

6. The method of claim 1 further including the step of controlling the power of the plasma generator to be between about 600 to about 5000 W.

7. The method of claim 1 wherein the growth pressure in the growth chamber is between 2-10 torr.

8. The method of claim 1 further including the step of controlling the temperature in the growth chamber to be between about 500 to about 850° C.

9. The method of claim 1 further including the step of isolating the deposition zones to prevent the mixing of the nitrogen plasma and Group IIIA metal alkyl organic reagent.

10. The method of claim 1 further including the step of heating one or more of the reagents prior to their entering the growth chamber.

11. The method of claim 1 further include a step of p-type doping of the growing film.

12. The method of claim 1 wherein there is a direct flow path between the nitrogen plasma inlet and the substrate.

13. A method of forming a thin film on a substrate by RPCVD including the steps of:
    a. introducing a nitrogen plasma through a nitrogen plasma inlet into a first deposition zone of a growth chamber;
    b. introducing a Group IIIA metal alkyl organic reagent through a Group IIIA reagent inlet into a second deposition zone of the growth chamber, the second deposition zone being substantially isolated from the first deposition zone;
    c. introducing ammonia through an additional reagent inlet into the second deposition zone such that the ammonia and the Group IIIA metal alkyl organic reagent mix prior to deposition; and
    d. moving the substrate between the first and second deposition zones, to thereby form the thin film on the substrate,
    wherein the nitrogen plasma introduced into the first deposition zone provides substantially all active nitrogen required for formation of the thin film on the substrate, and
    wherein the substrate is a 56×2" wafer arrangement and the ammonia is introduced at a relative flow rate of between about 1000 to 1500 sccm for this 56×2" wafer arrangement in the growth chamber.

14. The method of claim 13 further including the steps of controlling the power of the plasma generator to be between 500 to 5000 W and controlling the temperature in the growth chamber to be between 500 to 850° C.

15. A method of forming a thin film on a substrate by RPCVD including the steps of:
    a. introducing a nitrogen plasma through a nitrogen plasma inlet into a first deposition zone of a growth chamber;
    b. introducing a Group IIIA metal alkyl organic reagent through a Group IIIA reagent inlet into a second deposition zone of the growth chamber, the second deposition zone being substantially isolated from the first deposition zone;
    c. introducing ammonia through an additional reagent inlet into the second deposition zone such that the ammonia and the Group IIIA metal alkyl organic reagent mix prior to deposition; and
    d. moving the substrate between the first and second deposition zones, to thereby form the thin film on the substrate,
    wherein:
    (i) the nitrogen plasma introduced into the first deposition zone provides substantially all active nitrogen required for formation of the thin film on the substrate;
    (ii) the substrate is a 7×2" wafer arrangement and the ammonia is introduced at a relative flow rate of between about 160 to 250 sccm for this 7×2" wafer arrangement in the growth chamber or the substrate is a 56×2" wafer arrangement and the ammonia is introduced at a relative flow rate of between about 1000 to 1500 sccm for this 56×2" wafer arrangement in the growth chamber;
    (iii) the power of the plasma generator is between 500 to 2500 W;
    (iv) the growth chamber temperature is between about 700 to about 800° C.

\* \* \* \* \*